(12) United States Patent
Nakada et al.

(10) Patent No.: US 9,245,907 B2
(45) Date of Patent: Jan. 26, 2016

(54) DISPLAY DEVICE AND ELECTRONIC DEVICE

(71) Applicant: SEMICONDUCTOR ENERGY LABORATORY CO., LTD., Atsugi-shi, Kanagawa-ken (JP)

(72) Inventors: Masataka Nakada, Tochigi (JP); Hidenori Mori, Tochigi (JP); Hisashi Ohtani, Tochigi (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 4 days.

(21) Appl. No.: 14/217,585

(22) Filed: Mar. 18, 2014

(65) Prior Publication Data
US 2014/0291667 A1    Oct. 2, 2014

(30) Foreign Application Priority Data

Mar. 27, 2013   (JP) .................................. 2013-065702

(51) Int. Cl.
*G02F 1/136*  (2006.01)
*H01L 27/12*  (2006.01)
*G02F 1/1335* (2006.01)
(Continued)

(52) U.S. Cl.
CPC .......... *H01L 27/124* (2013.01); *G02F 1/13439* (2013.01); *G02F 1/133553* (2013.01); *G02F 2001/136218* (2013.01)

(58) Field of Classification Search
CPC ............ G02F 1/1368; G02F 1/133553; G02F 1/136227

USPC ........................................... 349/43, 113, 106
See application file for complete search history.

(56) References Cited

U.S. PATENT DOCUMENTS 6,500,701 B2   12/2002   Higashi et al.
6,653,216 B1   11/2003   Shimomaki et al.
(Continued)

FOREIGN PATENT DOCUMENTS

JP    11-352503 A    12/1999
JP    2000-162625 A   6/2000
(Continued)

OTHER PUBLICATIONS

International Search Report (Application No. PCT/JP2014/058156) Dated Jun. 17, 2014.

(Continued)

*Primary Examiner* — Thanh-Nhan P Nguyen
(74) *Attorney, Agent, or Firm* — Nixon Peabody LLP; Jeffrey L. Costellia

(57) ABSTRACT

A novel display device capable of excellent reflective display is provided. The display device includes a transistor including a gate electrode layer, a gate insulating layer over the gate electrode layer, a semiconductor layer over the gate insulating layer, and a source electrode layer and a drain electrode layer over the gate insulating layer and the semiconductor layer; a reflective electrode layer on the same plane as the source electrode layer and the drain electrode layer; a coloring layer overlapping with the reflective electrode layer; a pixel electrode layer overlapping with the coloring layer; and an anti-oxidation conductive layer connected to one of the source electrode layer and the drain electrode layer. The pixel electrode layer is connected to the transistor through the anti-oxidation conductive layer.

20 Claims, 11 Drawing Sheets

(51) Int. Cl.
*G02F 1/1343* (2006.01)
*G02F 1/1362* (2006.01)

(56) References Cited

U.S. PATENT DOCUMENTS

| | | | |
|---|---|---|---|
| 6,678,017 | B1 | 1/2004 | Shimomaki et al. |
| 7,522,226 | B2 | 4/2009 | Park et al. |
| 2009/0152560 | A1* | 6/2009 | Yagi et al. ............... 257/72 |
| 2011/0199404 | A1* | 8/2011 | Umezaki et al. .......... 345/691 |
| 2012/0162557 | A1* | 6/2012 | Nakazawa ........ G02F 1/136227 349/38 |

FOREIGN PATENT DOCUMENTS

| | | |
|---|---|---|
| JP | 2000-187209 A | 7/2000 |
| JP | 2003-195350 A | 7/2003 |
| JP | 2004-219515 A | 8/2004 |
| JP | 2010-165961 A | 7/2010 |

OTHER PUBLICATIONS

Written Opinion (Application No. PCT/JP2014/058156) Dated Jun. 17, 2014.

\* cited by examiner

DISPLAY DEVICE AND ELECTRONIC DEVICE

TECHNICAL FIELD

One embodiment of the present invention relates to a semiconductor device, a display device, a light-emitting device, or an electronic device. One embodiment of the present invention relates to, for example, a reflective liquid crystal display device. One embodiment of the present invention relates to a reflective liquid crystal display device with a COA structure.

Note that the term "display device" means a device including a display element. In addition, the display device also includes a driver circuit for driving a plurality of pixels, for example. Further, the display device includes a control circuit, a power supply circuit, a signal generation circuit, or the like formed over another substrate.

BACKGROUND ART

With the recent rapid spread of portable information terminals such as smartphones, improvement in their performance has progressed rapidly. Their screens have been increased in size and resolution, and some recent ones have resolutions as high as over 300 ppi.

In general, liquid crystal display devices perform color display using R, G, and B sub-pixels in a display region that are provided with their respective color filters. With the increase in resolution, the alignment accuracy between an active-matrix substrate (a substrate provided with an element (e.g., a transistor) for driving a pixel) and a counter substrate provided with a color filter has come to be recognized as a problem. In view of this problem, attention has been focused on what is called a color filter on array (COA) structure, in which a color filter is formed on the active-matrix substrate side.

As a liquid crystal display device with a COA structure, a reflective liquid crystal display device which includes a color filter, a pixel electrode, and a reflective layer on the TFT substrate side and in which light entering from the counter substrate side passes through the pixel electrode and the color filter and is reflected by the reflective layer below the pixel electrode and the color filter to return to the counter substrate side is disclosed (e.g., see Patent Document 1 and Patent Document 2).

PATENT DOCUMENT

[Patent Document 1] Japanese Published Patent Application No. 2000-187209
[Patent Document 2] Japanese Published Patent Application No. 2004-219515

DISCLOSURE OF INVENTION

In the structure disclosed in Patent Document 1, a color filter layer is formed directly on a metal layer serving as a reflective electrode; thus, in the case where a material with high reflectivity such as aluminum or an aluminum alloy is used for the metal layer, when the color filter layer is formed by a photolithography process, the metal layer is eroded by an alkaline developer during development of the color filter layer, which results in lowered reflectivity. In addition, a transparent electrode that is used as one electrode of a liquid crystal element is directly connected to the metal layer serving as a reflective electrode; thus, oxidation of the metal layer causes a contact failure between the transparent electrode and the reflective electrode.

In the structure disclosed in Patent Document 2, a reflective layer has a stacked-layer structure of a metal such as aluminum and a transparent conductive material so that surface oxidation of a contact region with a pixel electrode formed later is prevented. Placing such a transparent conductive material at the outermost surface of the reflective layer causes problems (for example, reflectivity is lowered and reflected light is colored depending on incident light wavelength) and results in lowered display quality. In addition, in the structure disclosed in Patent Document 2, the reflective layer and a color filter layer need to be formed over a TFT substrate and there is a problem of low productivity.

In view of the above problems, an object of one embodiment of the present invention is to provide a novel display device capable of excellent display. Another object of one embodiment of the present invention is to provide a novel display device of which productivity is improved. Another object of one embodiment of the present invention is to provide a novel display device capable of excellent reflective display. Another object of one embodiment of the present invention is to provide a novel display device with a COA structure that is capable of excellent reflective display.

Note that the descriptions of these objects do not disturb the existence of other objects. In one embodiment of the present invention, there is no need to achieve all the objects. Objects other than the above objects will be apparent from and can be derived from the description of the specification, the drawings, the claims, and the like.

One embodiment of the present invention is a display device that includes a transistor including a gate electrode layer, a gate insulating layer over the gate electrode layer, a semiconductor layer over the gate insulating layer, and a source electrode layer and a drain electrode layer over the gate insulating layer and the semiconductor layer; a reflective electrode layer on the same plane as the source electrode layer and the drain electrode layer; a coloring layer overlapping with the reflective electrode layer; a pixel electrode layer overlapping with the coloring layer; and an anti-oxidation conductive layer connected to one of the source electrode layer and the drain electrode layer. The pixel electrode layer is connected to the transistor through the anti-oxidation conductive layer.

As described above, the display device of one embodiment of the present invention includes a reflective electrode layer that is formed on the same plane as a source electrode layer and a drain electrode layer of a transistor. The reflective electrode layer in a reflective region is a conductive layer with high reflectivity. In a contact region between the transistor and a pixel electrode layer, an anti-oxidation conductive layer is formed over the conductive layer with high reflectivity. The anti-oxidation conductive layer can reduce contact failures between the pixel electrode layer and the source and drain electrode layers.

In other words, in the display device of one embodiment of the present invention, the conductive layer with high reflectivity is used in the reflective region, and the anti-oxidation conductive layer is used in the contact region between the transistor and the pixel electrode layer; thus, the display device is a novel display device which is capable of excellent reflective display and in which contact failures between a transistor and a pixel electrode layer are reduced.

In one embodiment of the present invention, a novel display device capable of excellent display can be provided. Further, in one embodiment of the present invention, a novel display device of which productivity is improved can be provided. Further, in one embodiment of the present invention, a novel display device capable of excellent reflective display can be provided. Further, in one embodiment of the present invention, a novel display device with a COA structure that is capable of excellent reflective display can be provided.

BEST MODE FOR CARRYING OUT THE INVENTION

Figure 1A:
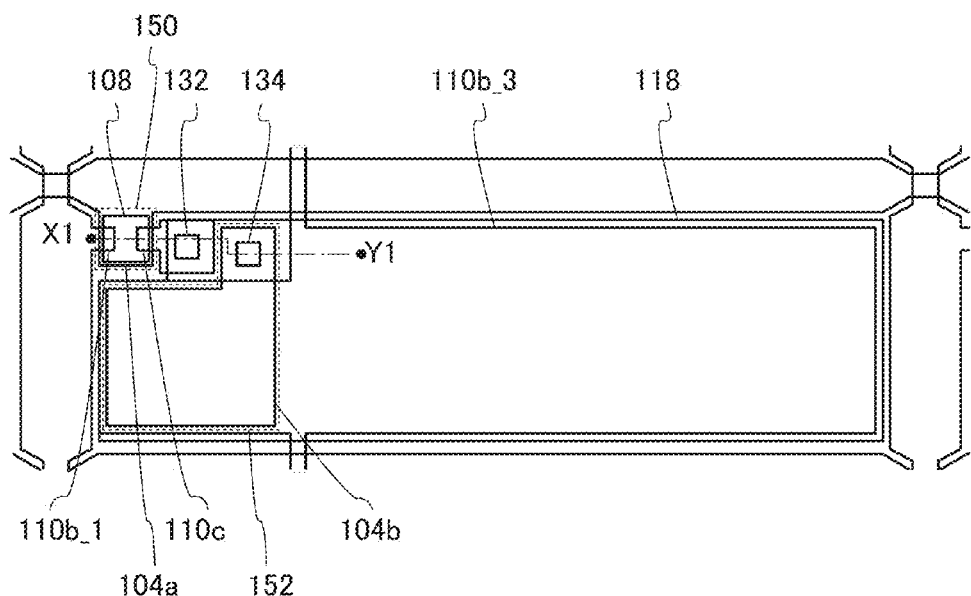
FIGS. 1A and 1B are a schematic top view and a cross-sectional view of a display device.

Hereinafter, embodiments will be described with reference to drawings. Note that the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such scales. Note that the drawings are schematic views showing ideal examples, and embodiments of the present invention are not limited to shapes or values shown in the drawings. For example, the following can be included: variation in signal, voltage, or current due to noise or difference in timing.

Note that in this specification, ordinal numbers such as "first", "second", and "third" are used in order to avoid confusion among components, and the terms do not limit the components numerically.

Note that in this specification, the phrase "A and B are connected" or "A is connected to B" means the case where A and B are electrically connected to each other as well as the case where A and B are directly connected to each other. Here, the phrase "A and B are electrically connected" or "A is electrically connected to B" means the following case: when an object having any electrical function exists between A and B, an electric signal can be transmitted and received between A and B.

Note that in this specification, terms for describing arrangement, such as "over" and "under", are used for convenience for describing the positional relation between components with reference to drawings. Further, the positional relation between components is changed as appropriate in accordance with a direction in which each component is described. Thus, the positional relation is not limited to that described with a term used in this specification and can be explained with another term as appropriate depending on the situation.

Note that the layout of circuit blocks in a block diagram in a drawing specifies the positional relation for description. Thus, even when a drawing shows that different functions are achieved in different circuit blocks, an actual circuit or region may be configured so that the different functions are achieved in the same circuit or region. Further, a function of each circuit block in a block diagram in a drawing is specified for description. Thus, even when one circuit block is illustrated, an actual circuit or region may be configured so that processing which is illustrated as being performed in the one circuit block is performed in a plurality of circuit blocks.

Embodiment 1

In this embodiment, a display device of one embodiment of the present invention will be described with reference to FIGS. 1A and 1B, FIGS. 2A to 2D, FIGS. 3A to 3D, and FIGS. 4A to 4C.

Figure 1B:
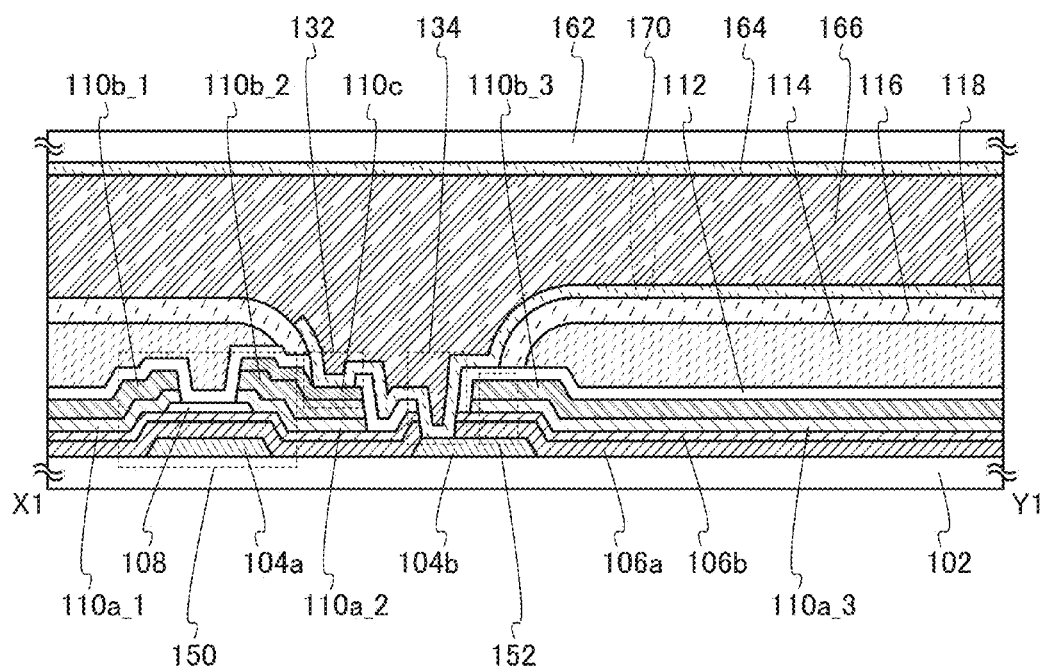

FIG. 1A is a top view of an example of a display device of one embodiment of the present invention. FIG. 1B is a cross-sectional view corresponding to a section plane taken along a dashed-dotted line X1-Y1 in FIG. 1A. In the top view of FIG. 1A, which shows part of a pixel portion in the display device, components such as a gate insulating layer and a coloring layer are partly omitted to avoid complexity.

In FIG. 1A, a transistor 150 includes a conductive layer 104a serving as a gate electrode layer, the gate insulating layer (not illustrated in FIG. 1A), a semiconductor layer 108 where a channel region is formed, and a conductive layer 110b_1 and a conductive layer 110b_2 (not illustrated in FIG. 1A) that serve as a source electrode layer and a drain electrode layer. The semiconductor layer 108 is formed over the gate insulating layer. An anti-oxidation conductive layer 110c is formed over the conductive layer 110b_2. Since the conductive layer 110b_2 and the anti-oxidation conductive layer 110c have substantially the same shape, the conductive layer 110b_2 is not to be seen in FIG. 1A. Note that the anti-oxidation conductive layer 110c can serve as part of the source electrode layer or the drain electrode layer.

Further, a conductive layer 104b that is formed in the same step as the conductive layer 104a serving as a gate electrode layer and a conductive layer 110b_3 that is formed in the same step as the conductive layers 110b_1 and 110b_2 serving as a source electrode layer and a drain electrode layer are stacked with the gate insulating layer positioned therebetween. The conductive layer 104b, the gate insulating layer, and the conductive layer 110b_3 form a capacitor 152.

The anti-oxidation conductive layer 110c serving as part of a source electrode layer or a drain electrode layer is connected to a pixel electrode layer 118 in an opening 132. The pixel electrode layer 118 is connected to the conductive layer 104b in an opening 134.

In FIG. 1A, the area of a region where a wiring connected to the conductive layer 110b_1 (hereinafter referred to as source line for convenience) and a wiring connected to the conductive layer 104a (hereinafter referred to as gate line for convenience) intersect with each other is preferably small. Reducing the area of the source line and the area of the gate line at the intersection of the two can reduce parasitic capacitance that can be generated between the source line and the gate line.

The conductive layer 110b_3 is provided to overlap with the coloring layer (not illustrated in FIG. 1A) and the pixel electrode layer 118. A liquid crystal layer (not illustrated in FIG. 1A) is provided over the pixel electrode layer 118. Note that the conductive layer 110b_3 serves as a reflective electrode layer.

In the structure in FIG. 1A, light (mainly external light) that enters the display device passes through at least the liquid crystal layer, the coloring layer, and the pixel electrode layer to be reflected by the conductive layer 110b_3. In other words, the display device in this embodiment can perform color display with the use of light reflected by the conductive layer 110b_3 serving as a reflective electrode layer.

The conductive layer 110b_3 serving as a reflective electrode layer in a reflective region has high reflectivity. In a contact region between the transistor 150 and the pixel electrode layer 118, an anti-oxidation conductive layer 110c is formed over the conductive layer 110b_2. The conductive layer 110c can reduce contact failures between the conductive layer 110b_2 serving as a source electrode layer or a drain electrode layer and the pixel electrode layer 118.

In other words, in the display device of one embodiment of the present invention, the conductive layer with high reflectivity is used in the reflective region, and the anti-oxidation conductive layer is used in the contact region with the pixel electrode layer; thus, the display device is a novel display device which is capable of excellent reflective display and in which contact failures between a transistor and a pixel electrode layer are reduced.

Now, the display device in FIG. 1A is specifically described with reference to FIG. 1B.

The display device in FIG. 1B includes a first substrate 102, the conductive layers 104a and 104b formed over the first substrate 102, an insulating layer 106a and an insulating layer 106b that are formed over the first substrate 102 and the conductive layers 104a and 104b, the semiconductor layer 108 formed over the insulating layer 106b, a conductive layer 110a_1, a conductive layer 110a_2, and a conductive layer 110a_3 that are formed over the insulating layer 106b and the semiconductor layer 108, the conductive layers 110b_1, 110b_2, and 110b_3 formed over the conductive layers 110a_1, 110a2, and 110a_3, the conductive layer 110c formed over the conductive layer 1101b_2, an insulating layer 112 formed over the semiconductor layer 108 and the conductive layers 110b_1, 110b_3, and 110c, a coloring layer 114 formed over the insulating layer 112, an insulating layer 116 formed over the coloring layer 114, and the pixel electrode layer 118 formed over the insulating layer 116 and connected to the conductive layers 104b and 110c.

The pixel electrode layer 118 is connected to the conductive layer 110c through the opening 132 provided in the insulating layer 112. Further, the pixel electrode layer 118 is connected to the conductive layer 104b through the opening 134 provided in the insulating layers 106a, 106b, and 112. In other words, the conductive layer 110c and the conductive layer 104b are connected to each other through the pixel electrode layer 118.

In the display device in FIG. 1B, a second substrate 162 is formed to face the first substrate 102, and a liquid crystal layer 166 is provided between the first substrate 102 and the second substrate 162.

A conductive layer 164 is formed under the second substrate 162. The pixel electrode layer 118, the liquid crystal layer 166, and the conductive layer 164 form a liquid crystal element 170. By application of voltage to the pixel electrode layer 118 and the conductive layer 164, the alignment state in the liquid crystal layer 166 can be controlled. That is, the pixel electrode layer 118 serves as one electrode of the liquid crystal element 170, and the conductive layer 164 serves as the other electrode of the liquid crystal element 170.

In FIG. 1B, the pixel electrode layer 118 and the conductive layer 164 are in contact with the liquid crystal layer 166; however, one embodiment of the present invention is not limited thereto. For example, alignment films may be formed in a region where the pixel electrode layer 118 is in contact with the liquid crystal layer 166 and a region where the conductive layer 164 is in contact with the liquid crystal layer 166.

As described above, the display device in FIG. 1B includes the transistor 150, the conductive layer 110b_3 serving as a reflective electrode layer that is formed on the same plane as the transistor 150, the coloring layer 114 formed to overlap with the conductive layer 110b_3 serving as a reflective electrode layer, the pixel electrode layer 118 formed to overlap with the coloring layer 114, and the conductive layer 110c electrically connected to the transistor 150. The transistor 150 and the pixel electrode layer 118 are connected to each other through the conductive layer 110c.

Accordingly, in the display device in FIGS. 1A and 1B, the conductive layer 110b_3 serving as a reflective electrode layer, the coloring layer 114, and the pixel electrode layer 118 can be formed over the first substrate 102; thus, as compared with the case where the coloring layer is formed on the second substrate 162 side, high alignment accuracy can be achieved. With this structure, even a liquid crystal display device with high pixel resolution (e.g., 300 ppi or more) can be a reflective liquid crystal display device capable of color display.

Note that other components of the display device in FIGS. 1A and 1B are described in detail in Method 1 for Manufacturing Display Device.

<Method 1 for Manufacturing Display Device>

A method for manufacturing the display device illustrated in FIGS. 1A and 1B is described below with reference to FIGS. 2A to 2D, FIGS. 3A to 3D, and FIGS. 4A to 4C.

First, the first substrate 102 is prepared. For the first substrate 102, a glass material such as aluminosilicate glass, aluminoborosilicate glass, or barium borosilicate glass is used. In the mass production, for the first substrate 102, a mother glass with any of the following sizes is preferably used: the 8th generation (2160 mm×2460 mm), the 9th generation (2400 mm×2800 mm, or 2450 mm×3050 mm), the 10th generation (2950 mm×3400 mm), and the like. High process temperature and a long period of process time drastically shrink the mother glass. Thus, in the case where mass production is performed with the use of the mother glass, it is preferable that the heat process in the manufacturing process be performed at a temperature lower than or equal to 600° C., preferably lower than or equal to 450° C., further preferably lower than or equal to 350° C.

Figure 2A:
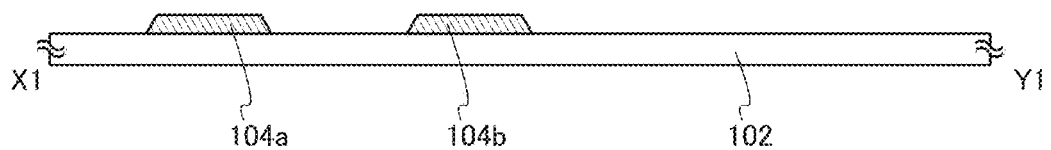
FIGS. 2A to 2D are cross-sectional views illustrating a method for manufacturing a display device.

Then, a conductive layer is formed over the first substrate 102 and processed into desired shapes, so that the conductive layers 104a and 104b are formed (see FIG. 2A).

For the conductive layers 104a and 104b, a metal element selected from aluminum, chromium, copper, tantalum, titanium, molybdenum, and tungsten, an alloy containing any of these metal elements as a component, an alloy containing these metal elements in combination, or the like can be used. In addition, the conductive layers 104a and 104b may have a single-layer structure or a stacked-layer structure of two or more layers. For example, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used. The conductive layers 104a and 104b can be formed by a sputtering method, for example.

Figure 2B:
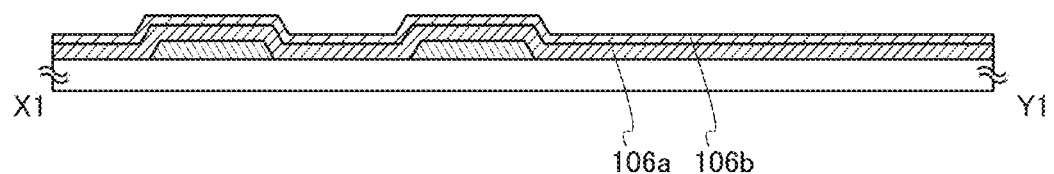

Next, the insulating layers 106a and 106b are formed over the first substrate 102 and the conductive layers 104a and 104b (see FIG. 2B).

The insulating layer 106a is formed to have a single-layer structure or a stacked-layer structure using, for example, any of a silicon nitride oxide film, a silicon nitride film, an aluminum oxide film, and the like with a PE-CVD apparatus. In the case where the insulating layer 106a has a stacked-layer structure, it is preferable that a silicon nitride film with fewer defects be provided as a first silicon nitride film, and a silicon nitride film from which hydrogen and ammonia are less likely to be released be provided over the first silicon nitride film, as a second silicon nitride film. As a result, hydrogen and nitrogen contained in the insulating layer 106a can be prevented from moving or diffusing into the semiconductor layer 108 formed later.

The insulating layer 106b is formed to have a single-layer structure or a stacked-layer structure using any of a silicon oxide film, a silicon oxynitride film, and the like with a PE-CVD apparatus.

As for the insulating layers 106a and 106b, for example, a 400-nm-thick silicon nitride film can be formed as the insulating layer 106a, and then a 50-nm-thick silicon oxynitride film can be formed as the insulating layer 106b. The silicon nitride film and the silicon oxynitride film are preferably formed in succession in a vacuum so that fewer impurities are mixed into the films. Note that portions of the insulating layers 106a and 106b overlapping with the conductive layer 104a serve as the gate insulating layer of the transistor 150. In addition, portions of the insulating layers 106a and 106b overlapping with the conductive layer 104b serve as a dielectric layer of the capacitor 152.

Note that silicon nitride oxide refers to an insulating material that contains more nitrogen than oxygen, whereas silicon oxynitride refers to an insulating material that contains more oxygen than nitrogen.

When the gate insulating layer has the above structure, the following effects can be obtained, for example. The silicon nitride film has a higher relative permittivity than a silicon oxide film and needs a larger thickness for an equivalent capacitance. Thus, the physical thickness of the gate insulating layer can be increased. This makes it possible to reduce a decrease in the withstand voltage of the transistor 150 and furthermore increase the withstand voltage, thereby preventing electrostatic breakdown of the transistor 150.

Figure 2C:
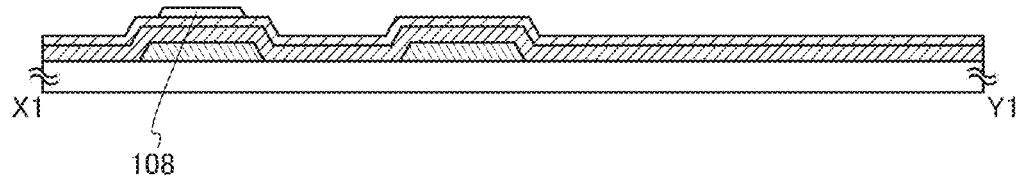

Next, a semiconductor layer is formed over the insulating layer 106b and processed into a desired shape, so that the semiconductor layer 108 with an island shape is formed (see FIG. 2C).

For the semiconductor layer 108, amorphous silicon, polycrystalline silicon, single crystal silicon, or the like can be used, for example. Alternatively, an oxide semiconductor may be used for the semiconductor layer 108. The oxide semiconductor preferably includes a material represented by an In-M-Zn oxide that contains at least indium (In), zinc (Zn), and M (M is a metal such as Al, Ga, Ge, Y, Zr, Sn, La, Ce, or Hf). Alternatively, both In and Zn are preferably contained.

As the oxide semiconductor, for example, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, or an In—Hf—Al—Zn oxide.

Note that, for example, an In—Ga—Zn oxide means an oxide containing In, Ga, and Zn as its main components and there is no particular limitation on the ratio of In to Ga and Zn. The In—Ga—Zn oxide may contain another metal element in addition to In, Ga, and Zn. In this embodiment, an oxide semiconductor is used for the semiconductor layer 108.

Next, first heat treatment is preferably performed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the oxide semiconductor that is used for the semiconductor layer 108 can be improved, and in addition, impurities such as hydrogen and water can be removed from the insulating layers 106a and 106b and the semiconductor layer 108. The first heat treatment may be performed before the oxide semiconductor is processed into an island shape.

Figure 2D:
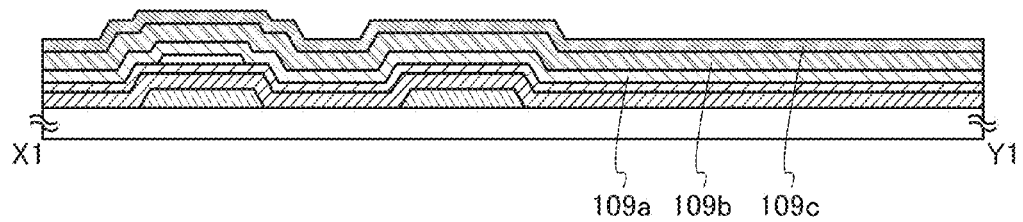

Next, a conductive layer 109a, a conductive layer 109b, and a conductive layer 109c are formed over the insulating layer 106b and the semiconductor layer 108 (see FIG. 2D).

The conductive layer 109a serves as a barrier metal. The conductive layer 109a can be formed using any material that provides excellent contact resistance between the conductive layer 109a and the semiconductor layer 108. For example, the conductive layer 109a is formed to have a single-layer structure or a stacked-layer structure including any of metals such as titanium, chromium, nickel, yttrium, zirconium, molybdenum, tantalum, and tungsten or an alloy containing any of these metals as its main component.

The conductive layer 109b, which is to serve as part of a reflective electrode layer, is preferably formed using a conductive material with high reflectivity. Further, the conductive layer 109b serves as part of the source electrode layer and part of the drain electrode layer of the transistor, and therefore is preferably formed using a low-resistance material. For example, the conductive layer 109b is formed to have a single-layer structure or a stacked-layer structure including any of metals such as aluminum, silver, palladium, and copper or an alloy containing any of these metals as its main component. It is particularly preferable to use a material including aluminum for the conductive layer 109b in terms of cost, processability, and the like.

The conductive layer 109c can be formed using any material that provides excellent contact resistance between the conductive layer 109c and the pixel electrode layer 118 connected later, and an anti-oxidation conductive layer can be used. For example, the conductive layer 109c is formed to have a single-layer structure or a stacked-layer structure including any of metals such as titanium, chromium, nickel, yttrium, molybdenum, tantalum, and tungsten, an alloy containing any of these metals as its main component, or a metal nitride containing any of these materials as its main component. It is particularly preferable to use a material including titanium or molybdenum for the conductive layer 109c, in which case excellent contact resistance between the conductive layer 109c and a material (e.g., ITO) used for the pixel electrode layer 118 can be provided.

For example, a titanium film or a titanium nitride film is used as the conductive layer 109a, an aluminum film or a silver film is used as the conductive layer 109b, and a titanium film or a titanium nitride film is used as the conductive layer 109c. Alternatively, a molybdenum film or a molybdenum nitride film is used as the conductive layer 109a, an aluminum film or a silver film is used as the conductive layer 109b, and a molybdenum film or a molybdenum nitride film is used as the conductive layer 109c.

Note that the structures of the conductive layers 109a, 109b, and 109c are not limited to the above, and a two-layer structure without the conductive layer 109a may be employed. An example of the two-layer structure is a structure in which an aluminum film is used as the conductive layer 109b and a titanium film is used as the conductive layer 109c.

The conductive layers 109a, 109b, and 109c can be formed by a sputtering method, for example.

Figure 3A:
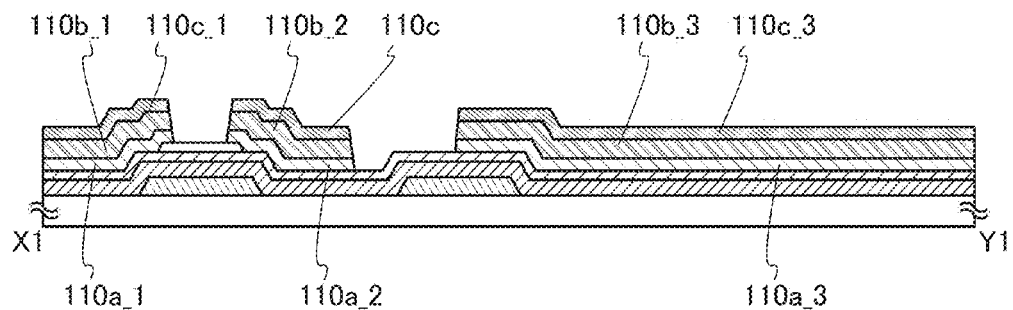
FIGS. 3A to 3D are cross-sectional views illustrating a method for manufacturing a display device.
Figure 3B:
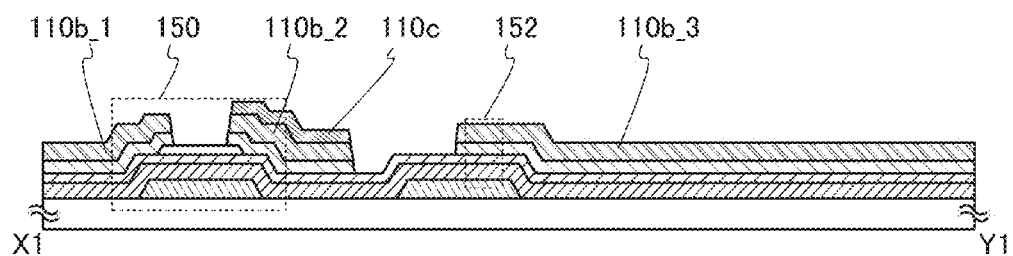

Then, the conductive layers 109a, 109b, and 109c are processed into desired shapes, so that the conductive layers 110a_1 and 110b_1, a conductive layer 110c_1, and the conductive layers 110a_2 and 110b_2, which serve as part of the source electrode layer and part of the drain electrode layer of the transistor 150, the anti-oxidation conductive layer 110c, and the conductive layers 110a_3 and 110b_3 and a conductive layer 110c_3, which serve as part of the reflective electrode layer and/or part of one electrode of the capacitor 152, are formed (see FIG. 3A).

Next, the conductive layers 110c_1 and 110c_3 are removed, so that the conductive layers 110b_1 and 110b_3 are exposed. At this stage, the transistor 150 and the capacitor 152 are formed (see FIG. 3B).

The conductive layers 110c_1 and 110c_3 are removed in such a manner that a mask is formed in a region where the conductive layers 110c_1 and 110c_3 are not formed and regions not covered with the mask are etched. Examples of a method for etching the conductive layers 110c_1 and 110c_3 include a dry etching method, a wet etching method, and plasma treatment.

In this embodiment, the conductive layers 110c_1 and 110c_3 are removed and the conductive layers 110b_1 and 110b_3 are exposed; however, one embodiment of the present invention is not limited thereto as long as at least the conductive layer 110b_3 serving as part of the reflective electrode layer is exposed and the conductive layer 110c is formed to be in contact with the pixel electrode layer 118 formed later.

When the conductive layers 110c_1 and 110c_3 are removed, surfaces of the conductive layers 110b_1 and 110b_3 are likely to become uneven. The uneven surfaces can diffusely reflect incident light. This is preferable when the conductive layer 110b_3 is used as the reflective electrode layer because the reflective electrode layer can have improved reflection efficiency.

The conductive layer 110c is obtained by processing in the same step as the conductive layers 110a_1, 110a_2, 110b_1, and 110b_2 serving as a source electrode layer and the drain electrode layer. Accordingly, at least part of the conductive layer 110c has substantially the same shape as the conductive layers serving as a source electrode layer and the drain electrode layer.

Figure 3C:
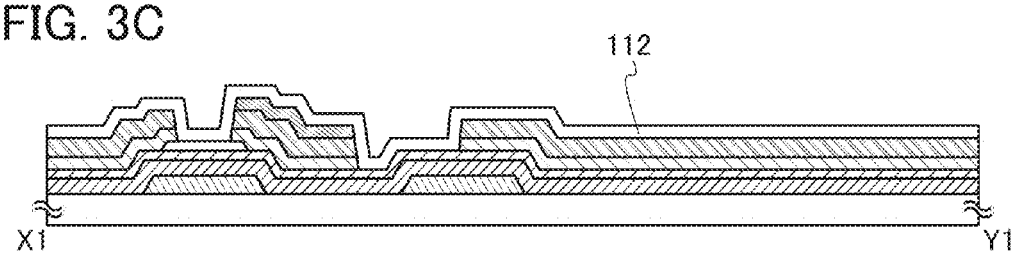

Next, the insulating layer 112 is formed over the insulating layer 106b, the semiconductor layer 108, and the conductive layers 110b_1, 110b_3, and 110c (see FIG. 3C).

For the insulating layer 112, an inorganic insulating material containing oxygen can be used in order to improve the characteristics of the interface with the oxide semiconductor used for the semiconductor layer 108. The insulating layer 112 can be formed by a PE-CVD method, for example.

As an example of the insulating layer 112, a silicon oxide film, a silicon oxynitride film, an aluminum oxide film, or the like having a thickness of greater than or equal to 50 nm and less than or equal to 500 nm can be used. In this embodiment, a 450-nm-thick silicon oxynitride film is used as the insulating layer 112.

Another insulating layer may be formed over the insulating layer 112. The insulating layer is a film formed using a material that can prevent an external impurity such as water, an alkali metal, or an alkaline earth metal from diffusing into the oxide semiconductor layer. For example, a silicon nitride film, a silicon nitride oxide film, or the like having a thickness of greater than or equal to 50 nm and less than or equal to 500 nm can be used as the insulating layer.

The insulating layer 112 over the conductive layer 110b_3 serving as a reflective electrode layer is preferably thin. For example, the thickness of the insulating layer 112 over the conductive layer 110b_3 is preferably greater than or equal to 1 nm and less than or equal to 100 nm, further preferably greater than or equal to 5 nm and less than or equal to 50 nm. Thinning the insulating layer 112 over the conductive layer 110b_3 can shorten the optical length between the conductive layer 110b_3 and the coloring layer 114. For example, the insulating layer 112 over the conductive layer 110b_3 serving as a reflective electrode layer is thinned in such a manner that, after the formation of the insulating layer 112, a mask is formed in a region other than the conductive layer 110b_3 and the insulating layer 112 over the conductive layer 110b_3 is etched.

Figure 3D:
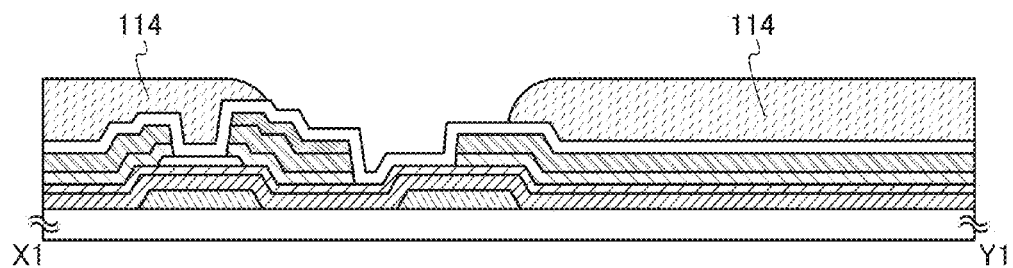

Next, the coloring layer 114 is formed in a desired region over the insulating layer 112 (see FIG. 3D).

The coloring layer 114 is a coloring layer having a function of transmitting light in a particular wavelength region. For example, a red (R) color filter for transmitting light in a red wavelength range, a green (G) color filter for transmitting light in a green wavelength range, a blue (B) color filter for transmitting light in a blue wavelength range, or the like can be used. Each color filter is formed in a desired position with any of various materials by a printing method, an inkjet method, an etching method using a photolithography technique, or the like.

Figure 4A:
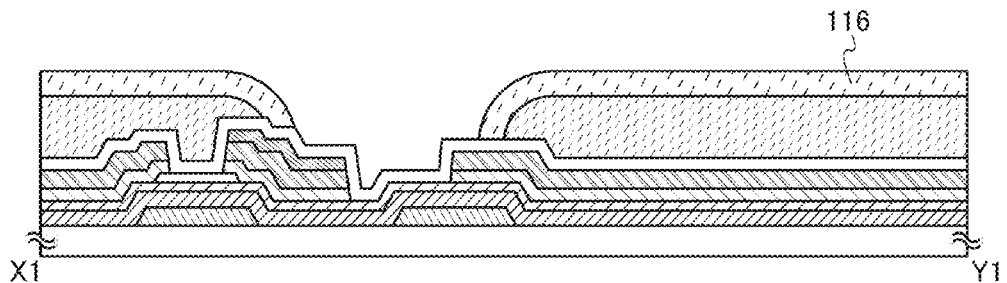
FIGS. 4A to 4C are cross-sectional views illustrating a method for manufacturing a display device.

Then, the insulating layer 116 is formed over the coloring layer 114 (see FIG. 4A).

For the insulating layer 116, an organic insulating film of an acrylic resin or the like can be used. With the insulating layer 116, an impurity or the like contained in the coloring layer 114 can be prevented from diffusing into the liquid crystal layer 166, for example. Moreover, the insulating layer 116 can planarize unevenness and the like due to the transistor 150. Note that the insulating layer 116 is not necessarily formed. A structure without the insulating layer 116 is preferable because it can have a shorter length of an optical path along which light that enters from the second substrate 162 side travels to the conductive layer 110b_3 serving as a reflective electrode layer.

Figure 4B:
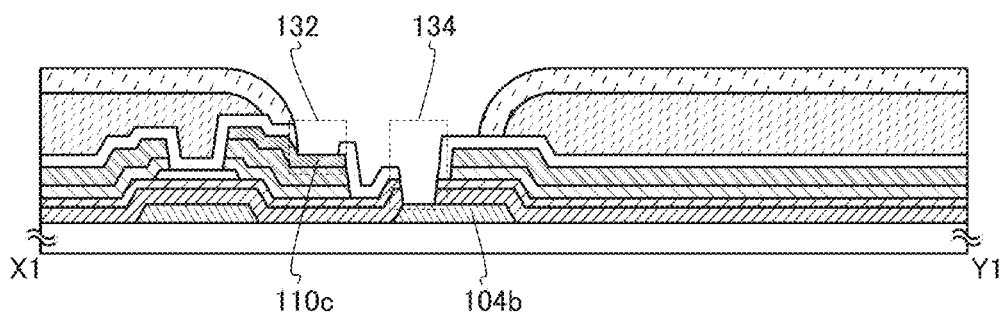

Next, the openings 132 and 134 are formed (see FIG. 4B).

The openings 132 and 134 are formed in desired regions so as to expose the conductive layers 110c and 104b, respectively. An example of a formation method of the openings 132 and 134 is, but is not limited to, a dry etching method. Alternatively, a wet etching method or a combination of dry etching and wet etching can be employed for formation of the openings 132 and 134.

Figure 4C:
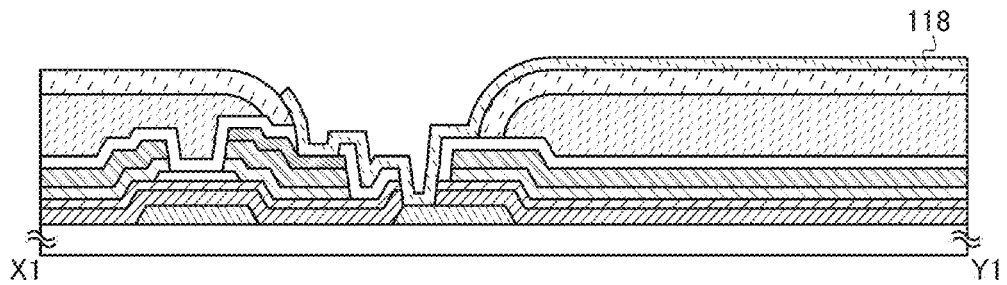

Then, the pixel electrode layer 118 is formed in a desired region over the insulating layer 116, the opening 132, and the opening 134 (see FIG. 4C).

A material having the property of transmitting visible light may be used for the pixel electrode layer 118. For example, a material including one of indium (In), zinc (Zn), and tin (Sn) is preferably used for the pixel electrode layer 118. The pixel electrode layer 118 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added. The pixel electrode layer 118 can be formed by a sputtering method, for example.

Owing to the formation of the pixel electrode layer 118, the conductive layer 110c and the conductive layer 104b are connected to each other through the pixel electrode layer 118.

Through the above process, the structure over the first substrate 102 can be formed.

Next, the first substrate 102 and the second substrate 162 are attached to each other and the liquid crystal layer 166 is formed.

Note that the second substrate 162 has the conductive layer 164. The conductive layer 164, which serves as the other electrode of the liquid crystal element 170, is preferably formed using a light-transmitting material. For materials that can be used for the conductive layer 164, refer to the materials for the pixel electrode layer 118.

The liquid crystal layer 166 can be formed by a dispenser method (a dropping method), or an injecting method by which a liquid crystal is injected using a capillary phenomenon after the first substrate 102 and the second substrate 162 are attached to each other.

Through the above process, the display device illustrated in FIGS. 1A and 1B can be manufactured.

Although not illustrated, in this embodiment, an alignment film or an optical film such as a polarizing plate, a circularly polarizing plate (including an elliptically polarizing plate), or a retardation plate (a quarter-wave plate or a half-wave plate) may be provided as appropriate if necessary. Further, the polarizing plate or the circularly polarizing plate may be provided with an anti-reflection film. For example, anti-glare treatment by which reflected light can be diffused by projections and depressions on the surface so as to reduce the glare can be performed.

Note that this embodiment can be combined with any of the other embodiments in this specification as appropriate.

Embodiment 2

In this embodiment, a modification example of the display device described in Embodiment 1 is described with reference to FIGS. 5A and 5B, FIGS. 6A to 6D, and FIGS. 7A to 7D. Note that portions having functions similar to those in Embodiment 1 are given the same reference numerals and detailed description thereof is omitted.

Figure 5A:
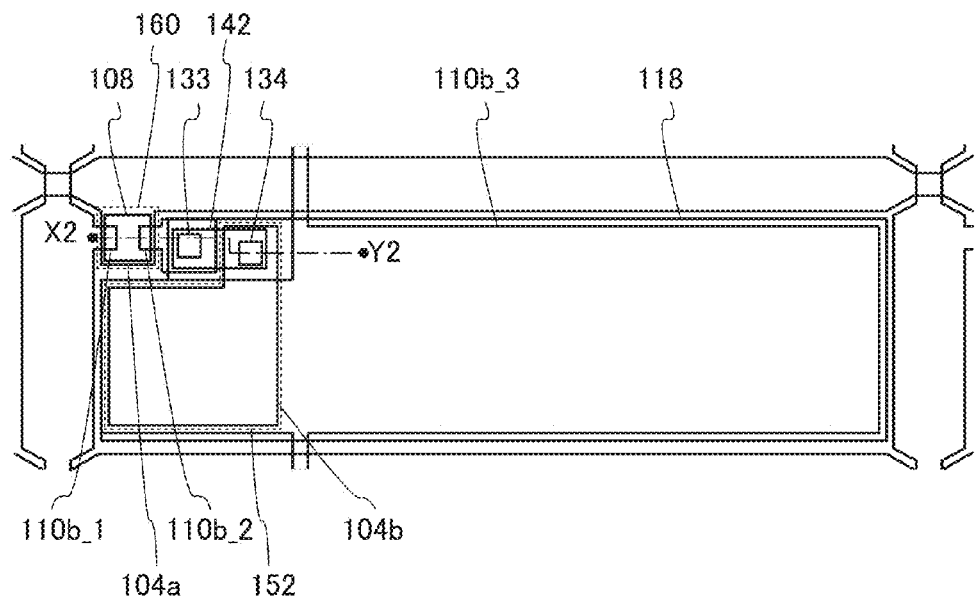
FIGS. 5A and 5B are a schematic top view and a cross-sectional view of a display device.
Figure 5B:
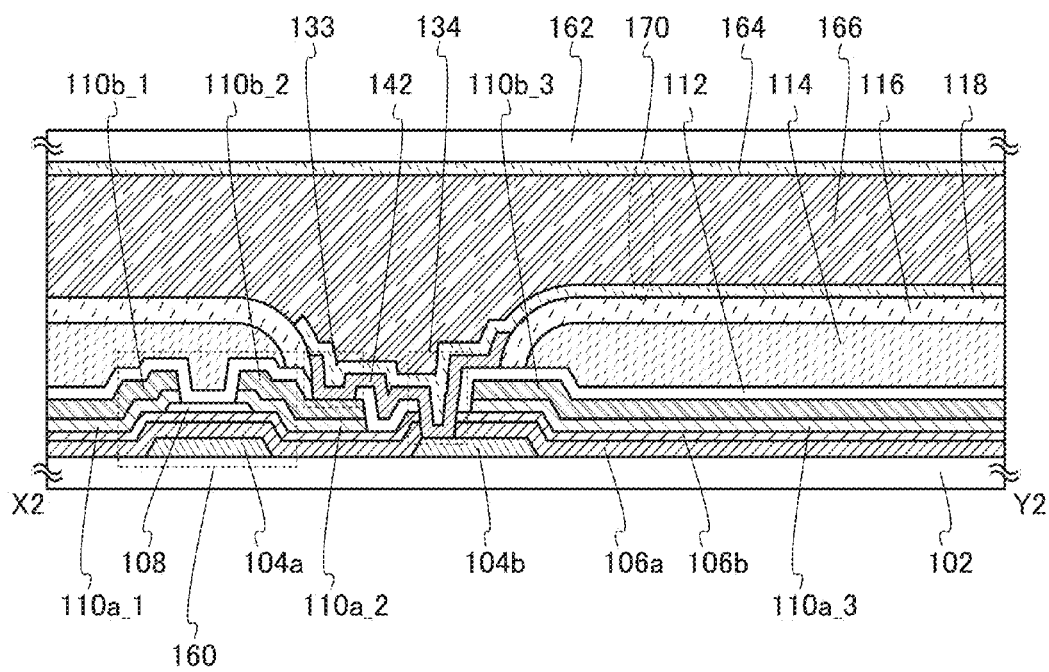

FIG. 5A is a top view of an example of a display device of one embodiment of the present invention. FIG. 5B is a cross-sectional view corresponding to a section plane taken along a dashed-dotted line X2-Y2 in FIG. 5A. In the top view of FIG. 5A, which shows part of a pixel portion in the display device, components such as a gate insulating layer and a coloring layer are partly omitted to avoid complexity.

In FIG. 5A, a transistor 160 includes the conductive layer 104a serving as a gate electrode layer, the gate insulating layer (not illustrated in FIG. 5A), the semiconductor layer 108 where a channel region is formed, and the conductive layers 110b_1 and 110b_2 serving as a source electrode layer and a drain electrode layer. The semiconductor layer 108 is formed over the gate insulating layer.

Further, the conductive layer 104b that is formed in the same step as the conductive layer 104a serving as a gate electrode layer and the conductive layer 110b_3 that is formed in the same step as the conductive layers 110b_1 and 110b_2 serving as a source electrode layer and a drain electrode layer are stacked with the gate insulating layer positioned therebetween. The conductive layer 104b, the gate insulating layer, and the conductive layer 110b_3 form the capacitor 152.

The conductive layer 110b_2 serving as a source electrode layer or a drain electrode layer is connected to a conductive layer 142 in an opening 133. The conductive layer 142 is connected to the conductive layer 104b in the opening 134. Further, the pixel electrode layer 118 is provided over and in contact with the conductive layer 142.

The conductive layer 110b_3 is provided to overlap with the coloring layer (not illustrated in FIG. 5A) and the pixel electrode layer 118. A liquid crystal layer (not illustrated in FIG. 5A) is provided over the pixel electrode layer 118. Note that the conductive layer 110b_3 serves as a reflective electrode layer.

In the structure in FIG. 5A, light (mainly external light) that enters the display device passes through at least the liquid crystal layer, the coloring layer, and the pixel electrode layer to be reflected by the conductive layer 110b_3. In other words, the display device in this embodiment can perform color display with the use of light reflected by the conductive layer 110b_3 serving as a reflective electrode layer.

In the display device in FIG. 5A, the conductive layer 110b_3 serving as a reflective electrode layer is formed on the same plane as the conductive layers 110b_1 and 110b_2 serving as a source electrode layer and a drain electrode layer of the transistor 160. The conductive layer 110b_3 serving as a reflective electrode layer in a reflective region has high reflectivity. In a contact region between the transistor 160 and the pixel electrode layer 118, the anti-oxidation conductive layer 142 is formed, and the transistor 160 and the pixel electrode layer 118 are connected to each other through the conductive layer 142. The conductive layer 142 can reduce contact failures between the conductive layer 110b_2 serving as a source electrode layer or a drain electrode layer and the pixel electrode layer 118.

In other words, in the display device of one embodiment of the present invention, the conductive layer with high reflectivity is used in the reflective region, and the anti-oxidation conductive layer is used in the contact region with the pixel electrode layer; thus, the display device is a novel display device which is capable of excellent reflective display and in which contact failures between a transistor and a pixel electrode layer are reduced.

Now, the display device in FIG. 5A is specifically described with reference to FIG. 5B.

The display device in FIG. 5B includes the first substrate 102, the conductive layers 104a and 104b formed over the first substrate 102, the insulating layers 106a and 106b formed over the first substrate 102 and the conductive layers 104a and 104b, the semiconductor layer 108 formed over the insulating layer 106b, the conductive layers 110a_1, 110a_2, and 110a_3 formed over the insulating layer 106b and the semiconductor layer 108, the conductive layers 110b_1, 110b_2, and 110b_3 formed over the conductive layers 110a_1, 110a_2, and 110a_3, the insulating layer 112 formed over the semiconductor layer 108 and the conductive layers 110b_1, 110b_2, and 110b_3, the coloring layer 114 formed over the insulating layer 112, the insulating layer 116 formed over the coloring layer 114, the anti-oxidation conductive layer 142 that is formed over the insulating layer 116 and connects the conductive layer 104b to the conductive layer 110b_2 through the opening 133 and the opening 134, and the pixel electrode layer 118 that is formed over the insulating layer 116 and the conductive layer 142 and connected to the conductive layer 142.

The conductive layer 142 is connected to the conductive layer 110b_2 through the opening 133 provided in the insulating layer 112. Further, the conductive layer 142 is connected to the conductive layer 104b through the opening 134 provided in the insulating layers 106a, 106b, and 112. In other words, the conductive layer 110b_2 and the conductive layer 104b are connected to each other through the conductive layer 142.

In the display device in FIG. 5B, the second substrate 162 is formed to face the first substrate 102, and the liquid crystal layer 166 is provided between the first substrate 102 and the second substrate 162.

The conductive layer 164 is formed under the second substrate 162. The pixel electrode layer 118, the liquid crystal layer 166, and the conductive layer 164 form the liquid crystal element 170. By application of voltage to the pixel electrode layer 118 and the conductive layer 164, the alignment state in the liquid crystal layer 166 can be controlled.

In FIG. 5B, the pixel electrode layer 118 and the conductive layer 164 are in contact with the liquid crystal layer 166; however, one embodiment of the present invention is not limited thereto. For example, alignment films may be formed in a region where the pixel electrode layer 118 is in contact with the liquid crystal layer 166 and a region where the conductive layer 164 is in contact with the liquid crystal layer 166.

As described above, the display device in FIG. 5B includes the transistor 160, the conductive layer 110b_3 serving as a reflective electrode layer that is formed on the same plane as the transistor 160, the coloring layer 114 formed to overlap with the conductive layer 110b_3 serving as a reflective electrode layer, the pixel electrode layer 118 formed to overlap with the coloring layer 114, and the conductive layer 142 electrically connected to the transistor 160. The transistor 160 and the pixel electrode layer 118 are connected to each other through the conductive layer 142.

Accordingly, in the display device in FIGS. 5A and 5B, the conductive layer 110b_3 serving as a reflective electrode layer, the coloring layer 114, and the pixel electrode layer 118 can be formed over the first substrate 102; thus, as compared with the case where the coloring layer is formed on the second substrate 162 side, high alignment accuracy can be achieved. With this structure, even a liquid crystal display device with high pixel resolution (e.g., 300 ppi or more) can be a reflective liquid crystal display device capable of color display.

The display device in FIGS. 5A and 5B differs from the display device in FIGS. 1A and 1B in that the opening 133 is formed instead of the opening 132 and the anti-oxidation conductive layer 142 is formed instead of the conductive layer 110c.

Note that other components of the display device in FIGS. 5A and 5B are described in detail in Method 2 for Manufacturing Display Device.

<Method 2 for Manufacturing Display Device>

A method for manufacturing the display device illustrated in FIGS. 5A and 5B is described below with reference to FIGS. 6A to 6D and FIGS. 7A to 7D.

Figure 6A:
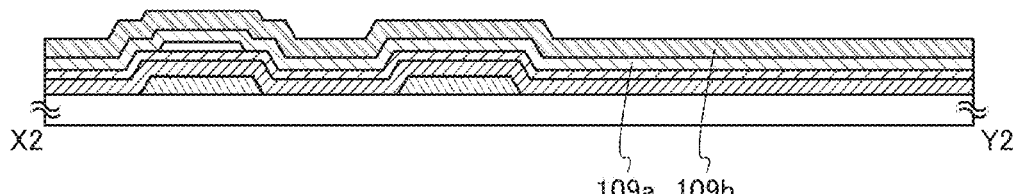
FIGS. 6A to 6D are cross-sectional views illustrating a method for manufacturing a display device.
Figure 6B:
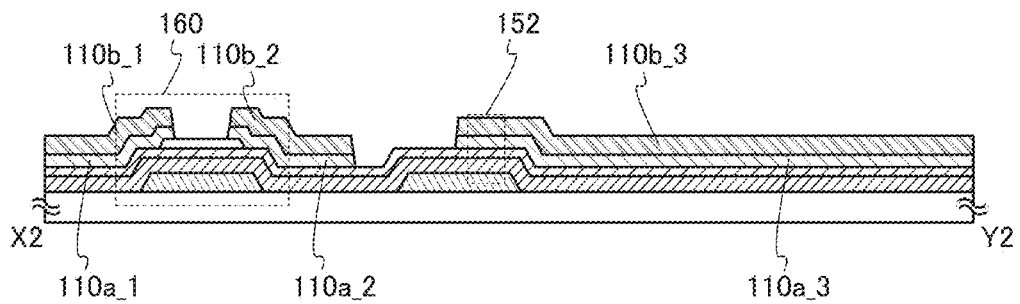
Figure 6C:
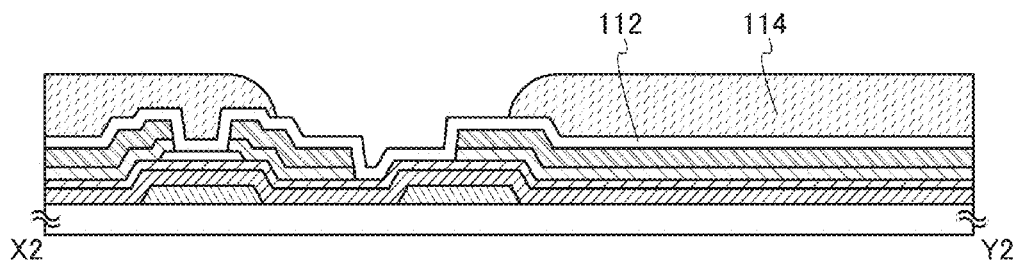

First, steps similar to the steps from FIG. 2A to FIG. 2C in Embodiment 1 are performed, and then, the conductive layers 109a and 109b are formed over the insulating layer 106b and the semiconductor layer 108 (see FIG. 6A).

Then, the conductive layers 109a and 109b are processed into desired shapes, so that the conductive layers 110a_1, 110b_1, 110a_2, and 110b_2, which serve as part of the source electrode layer and part of the drain electrode layer of the transistor 160, and the conductive layers 110a_3 and 110b_3, which serve as part of the reflective electrode layer and part of one electrode of the capacitor 152, are formed. At this stage, the transistor 160 and the capacitor 152 are formed (see FIG. 6B).

Next, the insulating layer 112 is formed over the insulating layer 106b, the semiconductor layer 108, and the conductive layers 110b_1, 110b_2, and 110b_3. Then, the coloring layer 114 is formed in a desired region over the insulating layer 112 (see FIG. 6C).

Figure 6D:
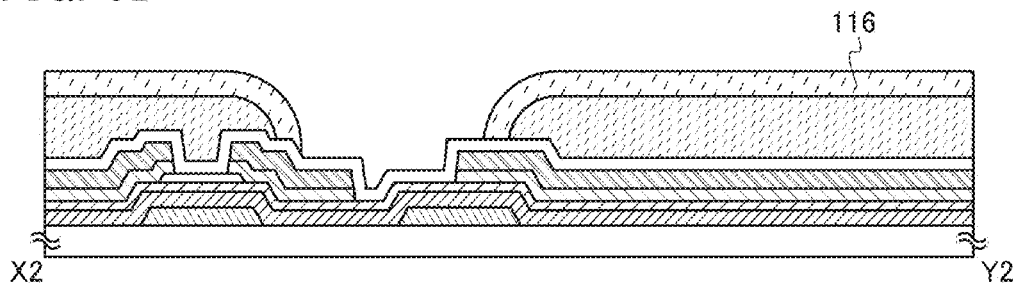

Then, the insulating layer 116 is formed over the coloring layer 114 (see FIG. 6D).

Figure 7A:
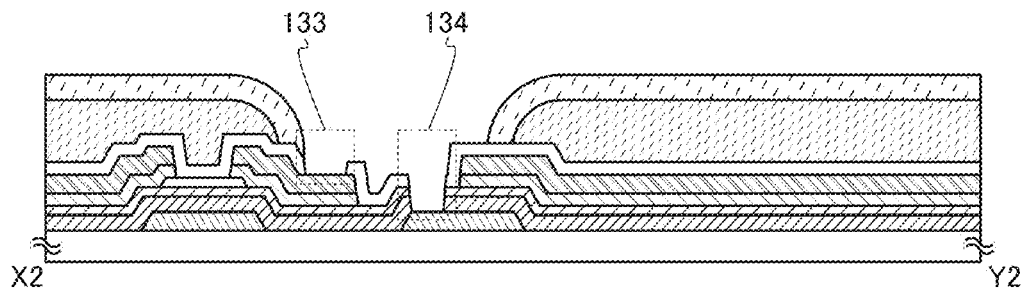
FIGS. 7A to 7D are cross-sectional views illustrating a method for manufacturing a display device.

Next, the openings 133 and 134 are formed (see FIG. 7A).

The openings 133 and 134 are formed in desired regions so as to expose the conductive layers 110b_2 and 104b, respectively. An example of a formation method of the openings 133 and 134 is, but is not limited to, a dry etching method. Alternatively, a wet etching method or a combination of dry etching and wet etching can be employed for formation of the openings 133 and 134.

Figure 7B:
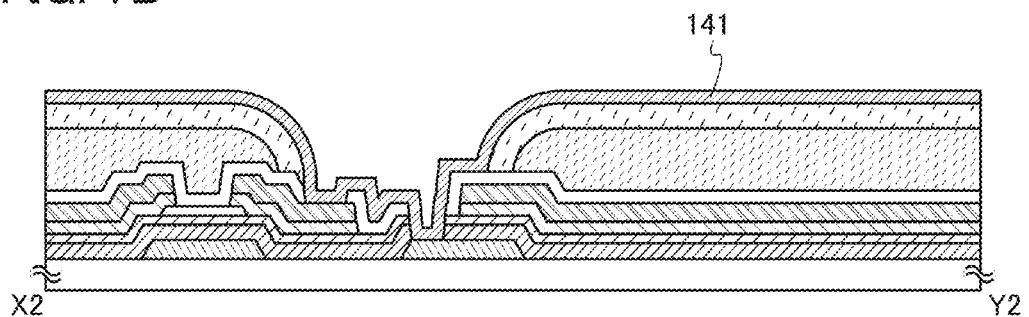

Then, a conductive layer 141 is formed over the insulating layer 116, the opening 133, and the opening 134 (see FIG. 7B).

The conductive layer 141 can be formed using a material similar to that of the conductive layer 109c described in Embodiment 1.

Figure 7C:
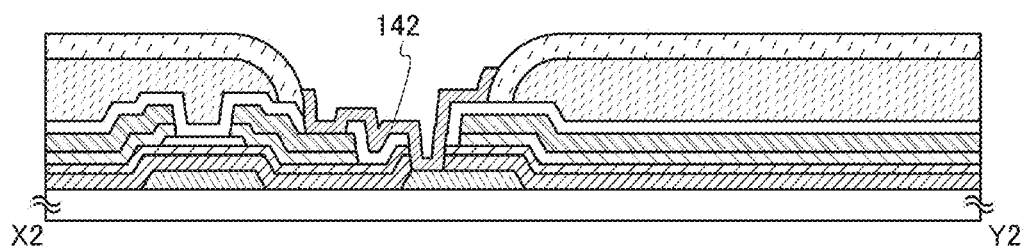

Then, the conductive layer 141 is processed into a desired shape, so that the conductive layer 142 is formed (see FIG. 7C).

Owing to the formation of the conductive layer 142, the conductive layer 110b_2 and the conductive layer 104b are connected to each other through the conductive layer 142.

The conductive layer 142 is formed in such a manner that a mask is formed over the conductive layer 141 and regions not covered with the mask are etched. Examples of a method for etching the conductive layer 141 include a dry etching method, a wet etching method, and plasma treatment.

Figure 7D:
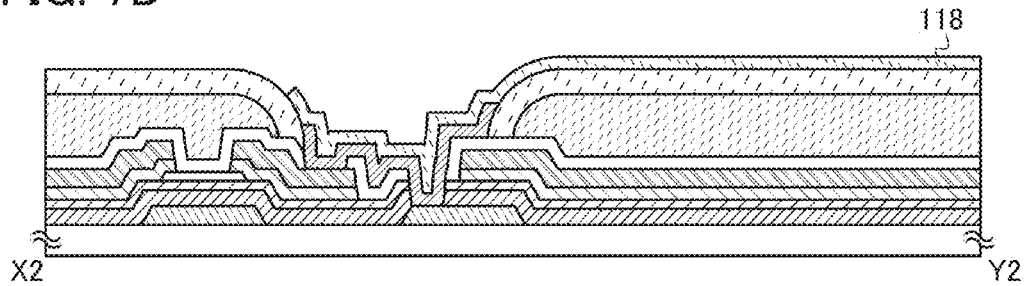

Next, the pixel electrode layer 118 is formed over the insulating layer 116 and the conductive layer 142 (see FIG. 7D).

Through the above process, the structure over the first substrate 102 can be formed.

Next, the first substrate 102 and the second substrate 162 are attached to each other and the liquid crystal layer 166 is formed.

Note that the second substrate 162 has the conductive layer 164. The conductive layer 164, which serves as the other electrode of the liquid crystal element 170, is preferably formed using a light-transmitting material. For materials that can be used for the conductive layer 164, refer to the materials for the pixel electrode layer 118.

The liquid crystal layer 166 can be formed by a dispenser method (a dropping method), or an injecting method by which a liquid crystal is injected using a capillary phenomenon after the first substrate 102 and the second substrate 162 are attached to each other.

Through the above process, the display device illustrated in FIGS. 5A and 5B can be manufactured.

Although not illustrated, in this embodiment, an alignment film or an optical film such as a polarizing plate, a circularly polarizing plate (including an elliptically polarizing plate), or a retardation plate (a quarter-wave plate or a half-wave plate) may be provided as appropriate if necessary. Further, the polarizing plate or the circularly polarizing plate may be provided with an anti-reflection film. For example, anti-glare treatment by which reflected light can be diffused by projections and depressions on the surface so as to reduce the glare can be performed.

Note that this embodiment can be combined with any of the other embodiments in this specification as appropriate.

Embodiment 3

In this embodiment, a modification example of the display device described in Embodiment 1 is described with reference to FIG. 8.

Figure 8:
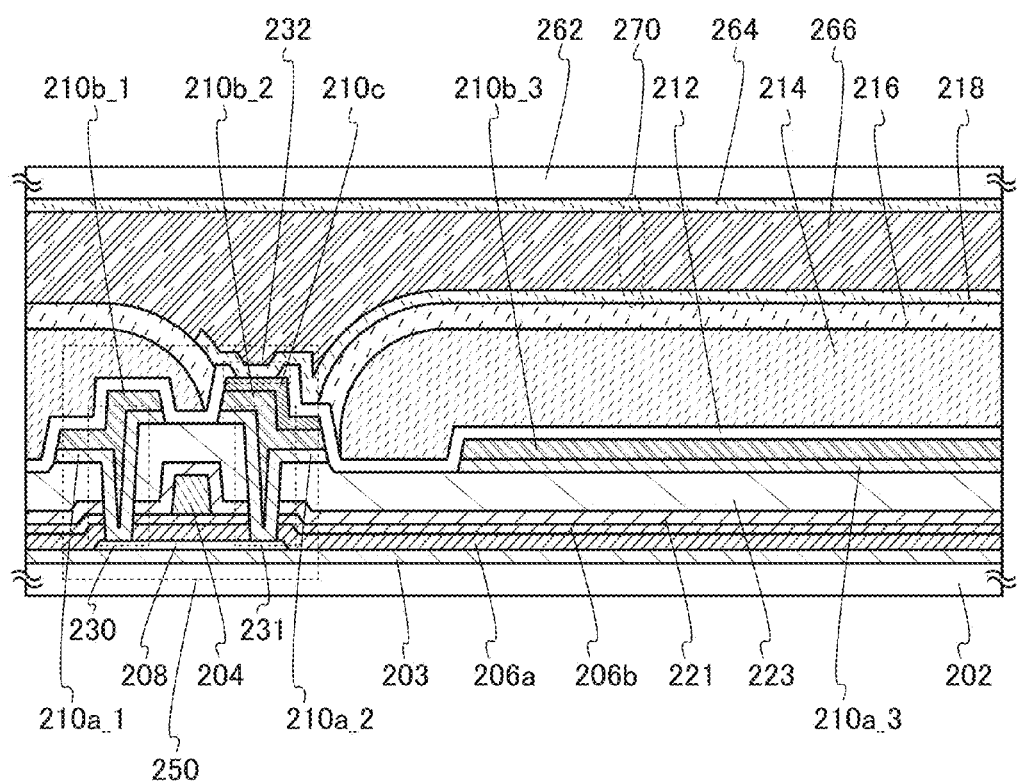
FIG. 8 is a cross-sectional view of a display device.

FIG. 8 is a cross-sectional view illustrating an example of a display device of one embodiment of the present invention.

The display device of one embodiment of the present invention in FIG. 8 includes a transistor 250 having a top-gate structure, unlike the display devices in Embodiments 1 and 2.

The transistor 250 includes a semiconductor layer 208 in which a channel region is formed, an insulating layer 206a and an insulating layer 206b serving as a gate insulating layer, a conductive layer 204 serving as a gate electrode layer, an insulating layer 221 and an insulating layer 223 serving as an interlayer insulating layer, and a conductive layer 210a_1, a conductive layer 210a_2, a conductive layer 210b_1, and a conductive layer 210b_2 serving as a source electrode layer and a drain electrode layer.

The display device in FIG. 8 includes a conductive layer 210a_3 and a conductive layer 210b_3 that are formed in the same step as the conductive layers 210a_1, 210a 2, 210b_1, and 210b_2 serving as a source electrode layer and a drain electrode layer of the transistor 250.

The conductive layer 210b_3 is provided to overlap with a coloring layer 214 and a pixel electrode layer 218. A liquid crystal layer 266 is provided over the pixel electrode layer 218. Note that the conductive layer 210b_3 serves as a reflective electrode layer.

Further, an anti-oxidation conductive layer 210c is formed over the conductive layer 210b_2 serving as a source electrode layer or a drain electrode layer. The conductive layer 210c is connected to the pixel electrode layer 218 through an opening 232.

In the structure in FIG. 8, light (mainly external light) that enters the display device passes through at least a second substrate 262, a conductive layer 264, the liquid crystal layer 266, the pixel electrode layer 218, an insulating layer 216, the coloring layer 214, and an insulating layer 212 to be reflected by the conductive layer 210b_3. In other words, the display device in this embodiment can perform color display with the use of light reflected by the conductive layer 210b_3 serving as a reflective electrode layer.

The display device in FIG. 8 includes a first substrate 202, a base insulating layer 203 formed over the first substrate 202, the semiconductor layer 208 formed over the base insulating layer 203, the insulating layers 206a and 206b formed over the base insulating layer 203 and the semiconductor layer 208, the conductive layer 204 formed over the insulating layer 206b, the insulating layers 221 and 223 formed over the insulating layer 206b and the conductive layer 204, an opening 230 and an opening 231 that are formed in the insulating layers 206a, 206b, 221, and 223 to reach the semiconductor layer 208, the conductive layers 210a_1 and 210a_2 formed over the insulating layer 223 to cover the openings 230 and 231, the conductive layer 210a_3 formed over the insulating layer 223, the conductive layers 210b_1, 210b_2, and 210b_3 formed over the conductive layers 210a_1, 210a_2, and 210a_3, the conductive layer 210c formed over the conductive layer 210b_2, the insulating layer 212 formed over the insulating layer 223 and the conductive layers 210b_1, 210b_3, and 210c, the coloring layer 214 formed over the insulating layer 212, the insulating layer 216 formed over the coloring layer 214, the opening 232 formed in the insulating layer 212 to reach the conductive layer 210c, and the pixel electrode layer 218 formed over the insulating layers 212 and 216 and connected to the conductive layer 210c in the opening 232.

In the display device in FIG. 8, the second substrate 262 is formed to face the first substrate 202, and the liquid crystal layer 266 is provided between the first substrate 202 and the second substrate 262.

The conductive layer 264 is formed under the second substrate 262. The pixel electrode layer 218, the liquid crystal layer 266, and the conductive layer 264 form a liquid crystal element 270. By application of voltage to the pixel electrode layer 218 and the conductive layer 264, the alignment state in the liquid crystal layer 266 can be controlled.

In FIG. 8, the pixel electrode layer 218 and the conductive layer 264 are in contact with the liquid crystal layer 266; however, one embodiment of the present invention is not limited thereto. For example, alignment films may be formed in a region where the pixel electrode layer 218 is in contact with the liquid crystal layer 266 and a region where the conductive layer 264 is in contact with the liquid crystal layer 266.

As described above, the display device in FIG. 8 includes the transistor 250, the conductive layer 210b_3 serving as a reflective electrode layer that is formed on the same plane as the transistor 250, the coloring layer 214 formed to overlap with the conductive layer 210b_3 serving as a reflective electrode layer, the pixel electrode layer 218 formed to overlap with the coloring layer 214, and the conductive layer 210c electrically connected to the transistor 250. The transistor 250 and the pixel electrode layer 218 are connected to each other through the conductive layer 210c.

Accordingly, in the display device in FIG. 8, the conductive layer 210b_3 serving as a reflective electrode layer, the coloring layer 214, and the pixel electrode layer 218 can be formed over the first substrate 202; thus, as compared with the case where the coloring layer is formed on the second substrate 262 side, high alignment accuracy can be achieved. With this structure, even a liquid crystal display device with high pixel resolution (e.g., 300 ppi or more) can be a reflective liquid crystal display device capable of color display.

Moreover, the anti-oxidation conductive layer 210c provided in a contact region between the transistor 250 and the pixel electrode layer 218 can reduce contact failures between the transistor 250 and the pixel electrode layer 218 in the display device.

As described above, a structure of a transistor that is used in a display device of one embodiment of the present invention is not particularly limited, and a top-gate transistor can be used instead of the bottom-gate transistors described in Embodiments 1 and 2.

Other components of the display device illustrated in FIG. 8 are described below.

For the first substrate 202, any of the materials for the first substrate 102 given in Embodiments 1 and 2 can be used.

The base insulating layer 203 has a function of preventing an impurity that can be contained in the first substrate 202 from entering the semiconductor layer 208. The base insulating layer 203 can be, for example, a stacked structure including a silicon nitride oxide film and a silicon oxynitride film. The silicon nitride oxide film and the silicon oxynitride film each can be formed with a PE-CVD apparatus to have a thickness of 50 nm to 300 nm.

For the semiconductor layer 208, any of the materials for the semiconductor layer 108 given in Embodiments 1 and 2 can be used. In this embodiment, polycrystalline silicon is used for the semiconductor layer 208.

For the insulating layers 206a and 206b, any of the materials for the insulating layers 106a and 106b given in Embodiments 1 and 2 can be used. For the conductive layer 204, any of the materials for the conductive layers 104a and 104b given in Embodiments 1 and 2 can be used.

The insulating layers 221 and 223 serve as an interlayer insulating layer. The insulating layers 221 and 223 are formed with a single-layer structure or a stacked-layer structure using, for example, any of a silicon nitride oxide film, a silicon nitride film, an aluminum oxide film, and the like with a PE-CVD apparatus. In the case where a material including silicon is used for the semiconductor layer 208, an insulating layer with a high hydrogen content is preferably used so that dangling bonds of the silicon are terminated with hydrogen. For example, the insulating layers 221 and 223 can be formed with a two-layer structure of a silicon oxynitride film (50 nm) and a silicon nitride oxide film (140 nm). Note that the structure of the insulating layers 221 and 223 serving as an interlayer insulating layer is not limited thereto and may be a three-layer structure. An example of the three-layer structure is a stacked structure of a silicon oxynitride film (50 nm), a silicon nitride oxide film (140 nm), and a silicon oxynitride film (520 nm).

The openings 230 and 231 can be formed in such a manner that desired regions of the insulating layers 206a and 206b serving as a gate insulating layer and the insulating layers 221 and 223 serving as an interlayer insulating layer are etched so as to expose the semiconductor layer 208.

For the conductive layers 210a_1, 210a_2, and 210a_3, any of the materials for the conductive layers 110a_1, 110a_2, and 110a_3 given in Embodiments 1 and 2 can be used. For the conductive layers 210b_1, 210b_2, and 210b_3, any of the materials for the conductive layers 110b_1, 110b_2, and 110b_3 given in Embodiments 1 and 2 can be used.

For the insulating layer 212, any of the materials for the insulating layer 112 given in Embodiments 1 and 2 can be used.

For the coloring layer 214, any of the materials for the coloring layer 114 given in Embodiments 1 and 2 can be used. For the insulating layer 216, any of the materials for the insulating layer 116 given in Embodiments 1 and 2 can be used.

The opening 232 is an opening that is formed in the insulating layer 212 to expose the conductive layer 210c. The opening 232 can be formed by etching a desired region. The etching may be wet etching, dry etching, or a combination of wet etching and dry etching.

In the opening 232, the conductive layer 210c serving as an anti-oxidation conductive layer and the pixel electrode layer 218 are connected to each other.

For the second substrate 262, the conductive layer 264, and the liquid crystal layer 266, any of the materials for the second substrate 162, the conductive layer 164, and the liquid crystal layer 166 given in Embodiments 1 and 2 can be used, respectively.

Note that this embodiment can be combined with any of the other embodiments in this specification as appropriate.

Embodiment 4

In this embodiment, a display device of one embodiment of the present invention will be described with reference to FIGS. 9A and 9B. Note that portions having functions similar to those in Embodiments 1 and 2 are given the same reference numerals and detailed description thereof is omitted.

The display device illustrated in FIG. 9A includes a region including pixels of display elements (hereinafter the region is referred to as pixel portion 302), a circuit portion being provided outside the pixel portion 302 and including a circuit for driving the pixels (hereinafter the portion is referred to as driver circuit portion 304), circuits each having a function of protecting an element (hereinafter the circuits are referred to as protection circuits 306), and a terminal portion 307. Note that the protection circuits 306 are not necessarily provided.

A part or the whole of the driver circuit portion 304 is preferably formed over a substrate over which the pixel portion 302 is formed, in which case the number of components and the number of terminals can be reduced. When a part or the whole of the driver circuit portion 304 is not formed over the substrate over which the pixel portion 302 is formed, the part or the whole of the driver circuit portion 304 can be mounted by COG or TAB.

The pixel portion 302 includes circuits for driving a plurality of display elements in X rows (X is a natural number of 2 or more) and Y columns (Y is a natural number of 2 or more) (hereinafter, such circuits are referred to as pixel circuit portions 308). The driver circuit portion 304 includes driver circuits such as a circuit for supplying a signal (scan signal) to select a pixel (hereinafter the circuit is referred to as gate driver 304a) and a circuit for supplying a signal (data signal) to drive a display element in a pixel (hereinafter, the circuit is referred to as source driver 304b).

The gate driver 304a includes a shift register or the like. The gate driver gate driver 304a receives a signal for driving the shift register through the terminal portion 307 and outputs a signal. For example, the gate driver 304a receives a start pulse signal, a clock signal, or the like and outputs a pulse signal. The gate driver 304a has a function of controlling the potentials of wirings supplied with scan signals (hereinafter, such wirings are referred to as scan lines GL_1 to GL_X). Note that a plurality of gate drivers 304a may be provided to control the scan lines GL_1 to GL_X separately. Alternatively, the gate driver 304a has a function of supplying an initialization signal. Without being limited thereto, the gate driver 304a can supply another signal.

The source driver 304b includes a shift register or the like. The source driver 304b receives a signal (video signal) from which a data signal is derived, as well as a signal for driving the shift register, through the terminal portion 307. The source driver 304b has a function of generating a data signal to be written in the pixel circuit portions 308 based on the video signal. In addition, the source driver 304b has a function of controlling output of a data signal in response to a pulse signal produced by input of a start pulse signal, a clock signal, or the like. Further, the source driver 304b has a function of controlling the potentials of wirings supplied with data signals (hereinafter such wirings are referred to as data lines DL_1 to DL_Y). Alternatively, the source driver 304b has a function of supplying an initialization signal. Without being limited thereto, the source driver 304b can supply another signal.

The source driver 304b includes a plurality of analog switches or the like, for example. The source driver 304b can output, as the data signals, signals obtained by time-dividing the video signal by sequentially turning on the plurality of analog switches.

A pulse signal and a data signal are input to each of the plurality of pixel circuit portions 308 through one of the plurality of scan lines GL supplied with scan signals and one of the plurality of data lines DL supplied with data signals, respectively. Writing and holding of the data signal in each of the plurality of pixel circuit portions 308 are performed by the gate driver 304a. For example, to the pixel circuit portion 308 in the m-th row and the n-th column (m is a natural number of less than or equal to X, and n is a natural number of less than or equal to Y), a pulse signal is input from the gate driver 304a through the scan line GL_m, and a data signal is input from the source driver 304b through the data line DL_n in accordance with the potential of the scan line GL_m.

Figure 9A:
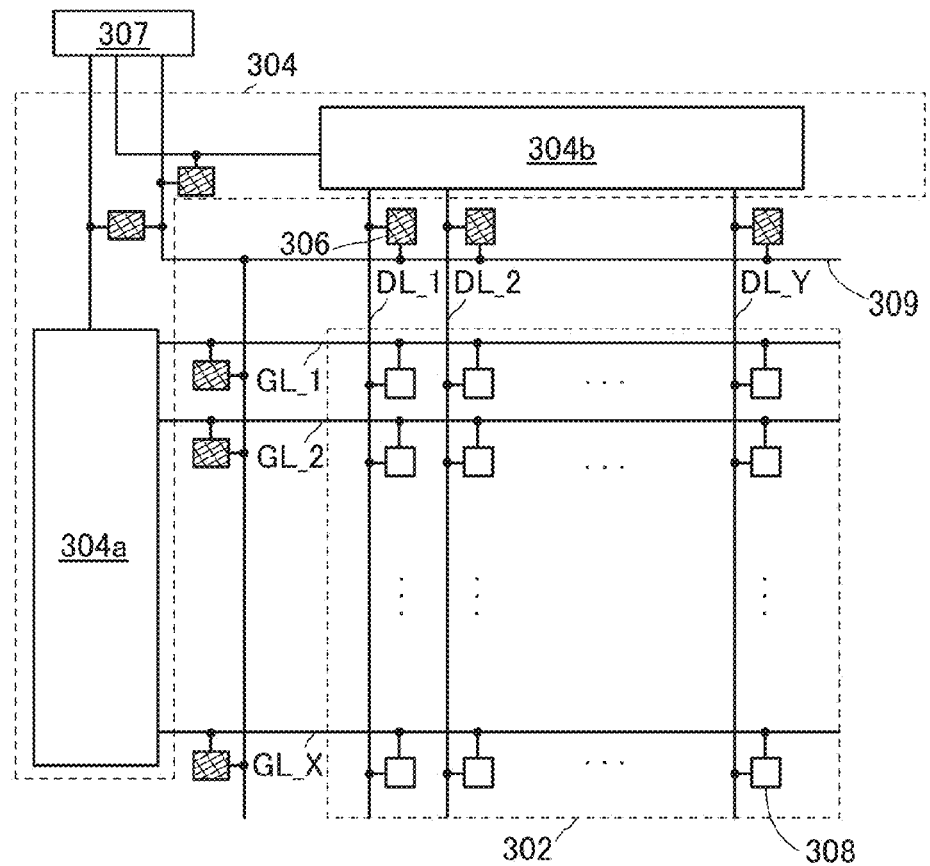
FIGS. 9A and 9B are circuit diagrams illustrating a display device.

The protection circuit 306 shown in FIG. 9A is connected to, for example, the scan line GL between the gate driver 304a and the pixel circuit portion 308. Alternatively, the protection circuit 306 is connected to the data line DL between the source driver 304b and the pixel circuit portion 308. Alternatively, the protection circuit 306 can be connected to a wiring between the gate driver 304a and the terminal portion 307. Alternatively, the protection circuit 306 can be connected to a wiring between the source driver 304b and the terminal portion 307. Note that the terminal portion 307 means a portion having terminals for inputting power, control signals, and video signals to the display device from external circuits.

The protection circuit 306 is a circuit which electrically connects a wiring connected to the protection circuit to another wiring when a potential out of a certain range is applied to the wiring connected to the protection circuit.

As illustrated in FIG. 9A, the protection circuits 306 are provided for the pixel portion 302 and the driver circuit portion 304, so that the resistance of the display device to overcurrent generated by electrostatic discharge (ESD) or the like can be improved. Note that the configuration of the protection circuits 306 is not limited to that, and for example, the protection circuit 306 may be configured to be connected to the gate driver 304a or the protection circuit 306 may be configured to be connected to the source driver 304b. Alternatively, the protection circuit 306 may be configured to be connected to the terminal portion 307.

In FIG. 9A, an example in which the driver circuit portion 304 includes the gate driver 304a and the source driver 304b is shown; however, the structure is not limited thereto. For example, only the gate driver 304a may be formed and a separately prepared substrate where a source driver circuit is formed (e.g., a driver circuit substrate formed with a single crystal semiconductor film or a polycrystalline semiconductor film) may be mounted.

Figure 9B:
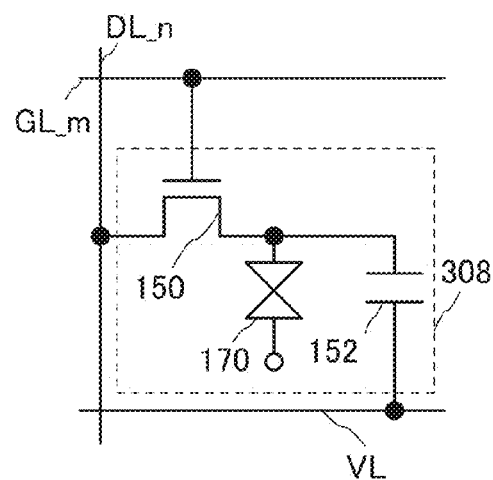

Each of the plurality of pixel circuit portions 308 in FIG. 9A can have the structure shown in FIG. 9B, for example.

The pixel circuit portion 308 illustrated in FIG. 9B includes the liquid crystal element 170, the transistor 150, and the capacitor 152. Note that the liquid crystal element 170, the transistor 150, and the capacitor 152 can be those in the display device in FIGS. 1A and 1B described in Embodiment 1. Instead of the transistor 150, the transistor 160 in Embodiment 2 or the transistor 250 in Embodiment 3 can be used.

The potential of one of a pair of electrodes of the liquid crystal element 170 is set in accordance with the specifications of the pixel circuit portion 308 as appropriate. The alignment state of the liquid crystal element 170 depends on written data. A common potential may be supplied to one of the pair of electrodes of the liquid crystal element 170 included in each of the plurality of pixel circuit portions 308. Further, the potential supplied to one of a pair of electrodes of the liquid crystal element 170 in the pixel circuit portion 308 in one row may be different from the potential supplied to one of a pair of electrodes of the liquid crystal element 170 in the pixel circuit portion 308 in another row.

As examples of a driving method of the display device including the liquid crystal element 170, any of the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples of the driving method of the display device include an electrically controlled birefringence (ECB) mode, a polymer dispersed liquid crystal (PDLC) mode, a polymer network liquid crystal (PNLC) mode, and a guest-host mode. Note that the present invention is not limited to these examples, and a variety of liquid crystal elements and driving methods can be applied to the liquid crystal element and the driving method thereof.

The liquid crystal element may be formed using a liquid crystal composition including liquid crystal exhibiting a blue phase and a chiral material. The liquid crystal exhibiting a blue phase has a short response time of 1 msec or less and is optically isotropic; therefore, alignment treatment is not necessary and viewing angle dependence is small.

In the pixel circuit portion 308 in the m-th row and the n-th column, one of a source and a drain of the transistor 150 is electrically connected to the data line DL_n, and the other is electrically connected to the other of a pair of electrodes of the liquid crystal element 170. A gate of the transistor 150 is electrically connected to the scan line GL_m. The transistor 150 has a function of controlling whether to write a data signal by being turned on or off.

One of a pair of electrodes of the capacitor 152 is electrically connected to a wiring to which a potential is supplied (hereinafter referred to as a potential supply line VL), and the other is electrically connected to the other of the pair of electrodes of the liquid crystal element 170. The potential of the potential supply line VL is set in accordance with the specifications of the pixel circuit portion 308 as appropriate. The capacitor 152 functions as a storage capacitor for storing written data.

For example, in the display device including the pixel circuit portion 308 in FIG. 9A, the pixel circuit portions 308 are sequentially selected row by row by the gate driver 304a, whereby the transistors 150 are turned on and a data signal is written.

When the transistors 150 are turned off, the pixel circuit portions 308 in which the data has been written are brought into a holding state. This operation is sequentially performed row by row; thus, an image is displayed.

The structure described in this embodiment can be used in appropriate combination with the structure described in any of the other embodiments.

Embodiment 5

In this embodiment, a display module and an electronic device that can be formed using a display device of one embodiment of the present invention will be described with reference to FIG. 10 and FIGS. 11A to 11H.

Figure 10:
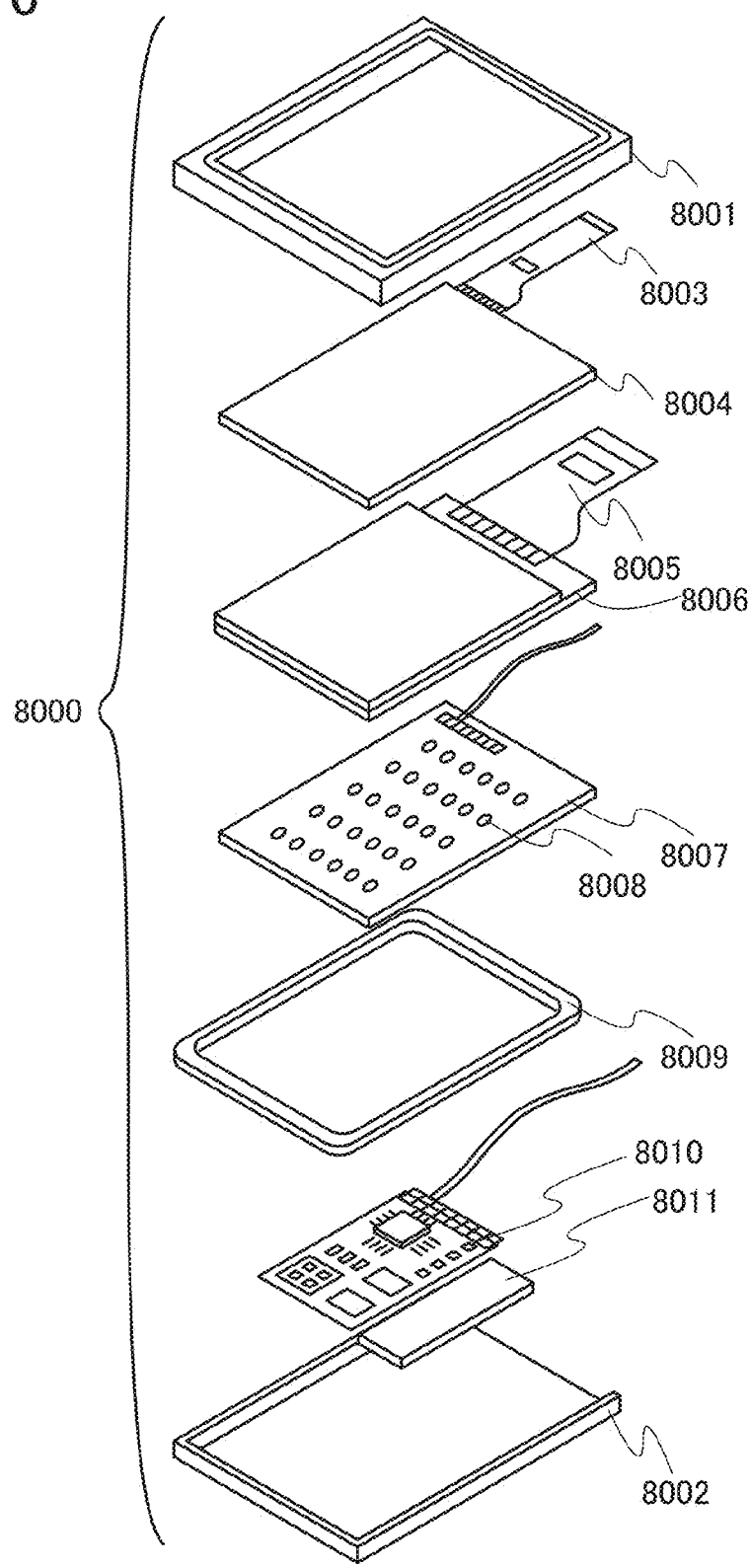
FIG. 10 illustrates a display module.

In a display module 8000 illustrated in FIG. 10, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002.

The display device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. A counter substrate (sealing substrate) of the display panel 8006 can have a touch panel function. A photosensor may be provided in each pixel of the display panel 8006 to form an optical touch panel.

The backlight unit 8007 includes a light source 8008. The light source 8008 may be provided at an end portion of the backlight unit 8007 and a light diffusing plate may be used.

Note that the backlight unit 8007 need not be provided in the case of a reflective liquid crystal display device.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 11A to 11H illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 11A:
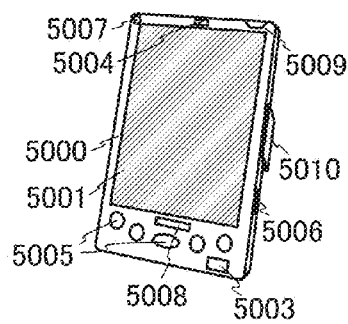
FIGS. 11A to 11H each illustrate an electronic device.
Figure 11B:
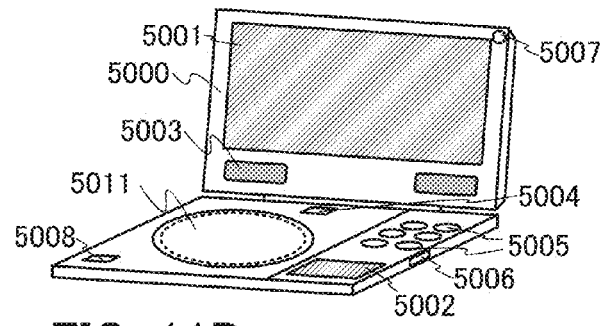
Figure 11C:
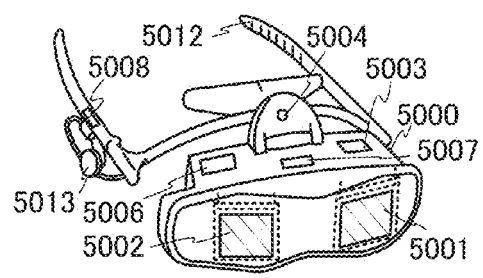

FIG. 11A illustrates a mobile computer which can include a switch 5009, an infrared port 5010, and the like in addition to the above components. FIG. 11B illustrates a portable image reproducing device (e.g., a DVD player) which is provided with a memory medium and can include a second display portion 5002, a memory medium reading portion 5011, and the like in addition to the above components. FIG. 11C illustrates a goggle-type display which can include the second display portion 5002, a support 5012, an earphone 5013, and the like in addition to the above components.

Figure 11D:
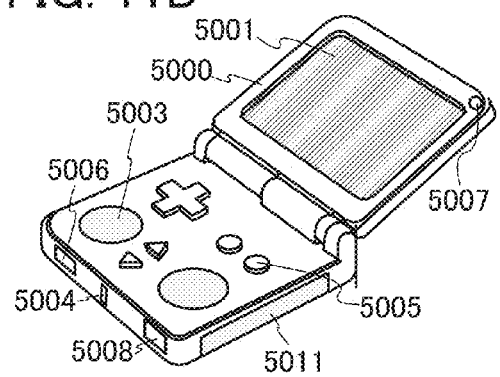
Figure 11E:
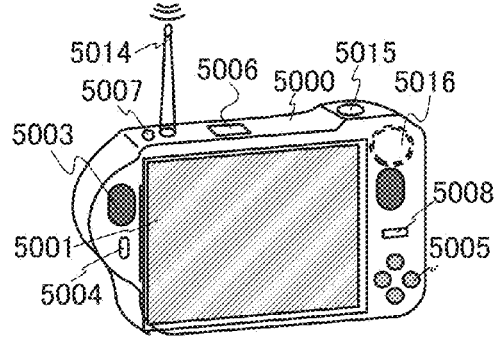
Figure 11F:
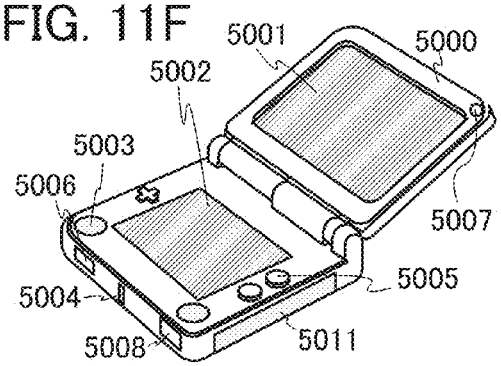
Figure 11G:
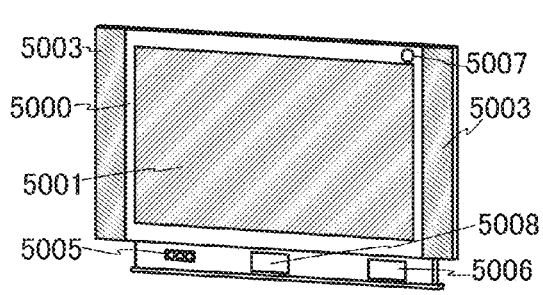
Figure 11H:
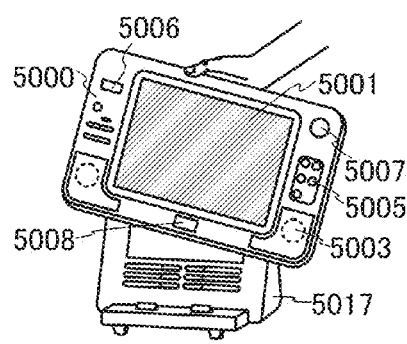

FIG. 11D illustrates a portable game machine which can include the memory medium reading portion 5011 and the like in addition to the above components. FIG. 11E illustrates a digital camera which has a television reception function and can include an antenna 5014, a shutter button 5015, an image receiving portion 5016, and the like in addition to the above components. FIG. 11F illustrates a portable game machine which can include the second display portion 5002, the memory medium reading portion 5011, and the like in addition to the above components. FIG. 11G illustrates a television receiver which can include a tuner, an image processing portion, and the like in addition to the above components. FIG. 11H illustrates a portable television receiver which can include a charger 5017 capable of transmitting and receiving signals, and the like in addition to the above components.

The electronic devices illustrated in FIGS. 11A to 11H can have a variety of functions. For example, a function of displaying a variety of data (a still image, a moving image, a text image, and the like) on a display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on a display portion, and the like can be given. Further, the electronic device including a plurality of display portions can have a function of displaying image data mainly on one display portion while displaying text data on another display portion, a function of displaying a three-dimensional image by displaying images on a plurality of display portions with a parallax taken into account, or the like. Furthermore, the electronic device including an image receiving portion can have a function of shooting a still image, a function of taking a moving image, a function of automatically or manually correcting a shot image, a function of storing a shot image in a memory medium (an external memory medium or a memory medium incorporated in the camera), a function of displaying a shot image on the display portion, or the like. Note that functions which can be provided for the electronic devices illustrated in FIGS. 11A to 11H are not limited to those described above, and the electronic devices can have a variety of functions.

The electronic devices described in this embodiment each include the display portion for displaying some sort of data.

The structure described in this embodiment can be used in appropriate combination with the structure described in any of the other embodiments.

EXPLANATION OF REFERENCE

102: first substrate, 104a: conductive layer, 104b: conductive layer, 106a: insulating layer, 106b: insulating layer, 108: semiconductor layer, 109a: conductive layer, 109b: conductive layer, 109c: conductive layer, 110a_1: conductive layer, 110a_2: conductive layer, 110a_3: conductive layer, 110b_1: conductive layer, 110b_2: conductive layer, 110b_3: conductive layer, 110c: conductive layer, 110c_1: conductive layer, 110c_3: conductive layer, 112: insulating layer, 114: coloring layer, 116: insulating layer, 118: pixel electrode layer, 132: opening, 133: opening, 134: opening, 141: conductive layer, 142: conductive layer, 150: transistor, 152: capacitor, 160: transistor, 162: second substrate, 164: conductive layer, 166: liquid crystal layer, 170: liquid crystal element, 202: first substrate, 203: base insulating layer, 204: conductive layer, 206a: insulating layer, 206b: insulating layer, 208: semiconductor layer, 210a_1: conductive layer, 210a2: conductive layer, 210a_3: conductive layer, 210b_1: conductive layer, 210b_2: conductive layer, 210b_3: conductive layer, 210c: conductive layer, 212: insulating layer, 214: coloring layer, 216: insulating layer, 218: pixel electrode layer, 221: insulating layer, 223: insulating layer, 230: opening, 231: opening, 232: opening, 250: transistor, 262: second substrate, 264: conductive layer, 266: liquid crystal layer, 270: liquid crystal element, 302: pixel portion, 304: driver circuit portion, 304a: gate driver, 304b: source driver, 306: protection circuit, 307: terminal portion, 308: pixel circuit portion, 5000: housing, 5001: display portion, 5002: display portion, 5003: speaker, 5004: LED lamp, 5005: operation key, 5006: connection terminal, 5007: sensor, 5008: microphone, 5009: switch, 5010: infrared port, 5011: memory medium reading portion, 5012: support, 5013: earphone, 5014: antenna, 5015: shutter button, 5016: image receiving portion, 5017: charger, 8000: display module, 8001: upper cover, 8002: lower cover, 8003: FPC, 8004: touch panel, 8005: FPC, 8006: display panel, 8007: backlight unit, 8008: light source, 8009: frame, 8010: printed board, 8011: battery.

This application is based on Japanese Patent Application serial no. 2013-065702 filed with Japan Patent Office on Mar. 27, 2013, the entire contents of which are hereby incorporated by reference.

The invention claimed is:

1. A display device comprising:
a transistor over a substrate, the transistor comprising:
a semiconductor layer; and
source and drain electrode layers over the semiconductor layer;
a reflective electrode layer in a same layer as the source and drain electrode layers;
an anti-oxidation conductive layer over and in contact with one of the source and drain electrode layers;
an insulating layer over the source and drain electrode layers and the reflective electrode layer;
a coloring layer overlapping with the reflective electrode layer; and
a pixel electrode layer over and in contact with the anti-oxidation conductive layer,
wherein the pixel electrode layer and the coloring layer overlap with each other, and
wherein the pixel electrode layer is connected to the one of the source and drain electrode layers through the anti-oxidation conductive layer.

2. The display device according to claim 1, further comprising a gate electrode layer over the substrate,
wherein the gate electrode layer and the semiconductor layer overlap with each other with a gate insulating layer interposed therebetween.

3. The display device according to claim 2, further comprising a second conductive layer under the gate insulating layer,
wherein the gate electrode layer and the second conductive layer exist in a same layer.

4. The display device according to claim 3, wherein the second conductive layer is connected to the transistor through the anti-oxidation conductive layer or the pixel electrode layer.

5. The display device according to claim 1, wherein at least a part of the anti-oxidation conductive layer has a same shape as the one of the source and drain electrode layers.

6. The display device according to claim 1, wherein the insulating layer is in contact with a top surface of the other of the source and drain electrode layers, a top surface of the anti-oxidation conductive layer, and a top surface of the reflective electrode layer.

7. The display device according to claim 1,
wherein the insulating layer includes an opening, and
wherein the anti-oxidation conductive layer is in contact with the one of the source and drain electrode layers through the opening of the insulating layer.

8. The display device according to claim 1, wherein the anti-oxidation conductive layer comprises titanium or molybdenum.

9. The display device according to claim 1, wherein the reflective electrode layer comprises aluminum.

10. An electronic device comprising the display device according to claim 1.

11. A display device comprising:
a transistor over a first substrate, the transistor comprising:
a semiconductor layer; and
source and drain electrode layers over the semiconductor layer;
a reflective electrode layer in a same layer as the source and drain electrode layers;
an anti-oxidation conductive layer over and in contact with one of the source and drain electrode layers;
an insulating layer over the source and drain electrode layers and the reflective electrode layer;
a coloring layer overlapping with the reflective electrode layer;
a pixel electrode layer over and in contact with the anti-oxidation conductive layer and over the coloring layer;
a liquid crystal layer over the pixel electrode layer; and
a second substrate over the liquid crystal layer,
wherein the pixel electrode layer is connected to the one of the source and drain electrode layers through the anti-oxidation conductive layer.

12. The display device according to claim 11, further comprising a gate electrode layer over the first substrate,
wherein the gate electrode layer and the semiconductor layer overlap with each other with a gate insulating layer interposed therebetween.

13. The display device according to claim 12, further comprising a second conductive layer under the gate insulating layer,
wherein the gate electrode layer and the second conductive layer exist in a same layer.

14. The display device according to claim 13, wherein the second conductive layer is connected to the transistor through the anti-oxidation conductive layer or the pixel electrode layer.

15. The display device according to claim 11, wherein at least a part of the anti-oxidation conductive layer has a same shape as the one of the source and drain electrode layers.

16. The display device according to claim 11, wherein the insulating layer is in contact with a top surface of the other of the source and drain electrode layers, a top surface of the anti-oxidation conductive layer, and a top surface of the reflective electrode layer.

17. The display device according to claim 11,
wherein the insulating layer includes an opening, and
wherein the anti-oxidation conductive layer is in contact with the one of the source and drain electrode layers through the opening of the insulating layer.

18. The display device according to claim 11, wherein the anti-oxidation conductive layer comprises titanium or molybdenum.

19. The display device according to claim 11, wherein the reflective electrode layer comprises aluminum.

20. An electronic device comprising the display device according to claim 11.

* * * * *